US009449813B2

(12) United States Patent
Sano et al.

(10) Patent No.: US 9,449,813 B2
(45) Date of Patent: Sep. 20, 2016

(54) METHOD OF MANUFACTURING SEMICONDUCTOR DEVICE, SUBSTRATE PROCESSING APPARATUS AND NON-TRANSITORY COMPUTER-READABLE RECORDING MEDIUM

(71) Applicant: Hitachi Kokusai Electric Inc., Tokyo (JP)

(72) Inventors: Atsushi Sano, Toyama (JP); Yoshiro Hirose, Toyama (JP); Tsukasa Kamakura, Toyama (JP)

(73) Assignee: HITACHI KOKUSAI ELECTRIC INC., Tokyo (JP)

( * ) Notice: Subject to any disclaimer, the term of this patent is extended or adjusted under 35 U.S.C. 154(b) by 0 days.

(21) Appl. No.: 14/305,364

(22) Filed: Jun. 16, 2014

(65) Prior Publication Data

US 2014/0370692 A1     Dec. 18, 2014

(30) Foreign Application Priority Data

Jun. 18, 2013   (JP) ................................ 2013-127264

(51) Int. Cl.
| | |
|---|---|
| *H01L 21/20* | (2006.01) |
| *H01L 21/36* | (2006.01) |
| *H01L 21/02* | (2006.01) |
| *C23C 16/34* | (2006.01) |
| *C23C 16/36* | (2006.01) |
| *C23C 16/455* | (2006.01) |

(52) U.S. Cl.
CPC ......... *H01L 21/0228* (2013.01); *C23C 16/342* (2013.01); *C23C 16/36* (2013.01); *C23C 16/45531* (2013.01); *C23C 16/45546* (2013.01); *H01L 21/02112* (2013.01); *H01L 21/02274* (2013.01)

(58) Field of Classification Search
CPC . C23C 16/36; C23C 16/45531; C23C 16/30; H01L 21/02167; H01L 21/02126; H01L 21/0228; H01L 21/02211; H01L 21/02172; H01L 21/02

USPC ......... 438/584, 658–758; 257/437, 626, 632, 257/634, 646, E21.159, E23.025, E23.077, 257/E23.116, E23.126, E33.06, E31.119; 427/255.391, 255.39, 255.394, 249.17, 427/249.19

See application file for complete search history.

(56) References Cited

U.S. PATENT DOCUMENTS

| | | | | |
|---|---|---|---|---|
| 5,096,740 | A | * | 3/1992 | Nakagama et al. .......... 427/586 |
| 2009/0221136 | A1 | * | 9/2009 | Krueger ................. H01J 37/08 438/513 |
| 2012/0009802 | A1 | * | 1/2012 | LaVoie et al. ................ 438/783 |

FOREIGN PATENT DOCUMENTS

| | | |
|---|---|---|
| JP | 2009-065203 A | 3/2009 |
| KR | 10-2007-0082787 A | 8/2007 |

OTHER PUBLICATIONS

Korean Notice of Reasons for Rejection, KR Application No. 10-2014-0071930, Aug. 25, 2015, 5 pgs. (English translation provided).

*Primary Examiner* — Charles Garber
*Assistant Examiner* — Abdulfattah Mustapha
(74) *Attorney, Agent, or Firm* — Volpe and Koenig, P.C.

(57) ABSTRACT

Provided is a method of manufacturing a semiconductor device, which is capable of increasing the controllability of the concentration of carbon in a film by increasing the yield when a boron carbonitride film or a boron nitride film is formed. The method includes forming a film containing boron, carbon and nitrogen or a film containing boron and nitrogen on the substrate by performing, a predetermined number of times, a cycle including supplying a source gas consisting of boron and a halogen element to a substrate and supplying a reactive gas consisting of carbon, nitrogen and hydrogen to the substrate.

11 Claims, 17 Drawing Sheets

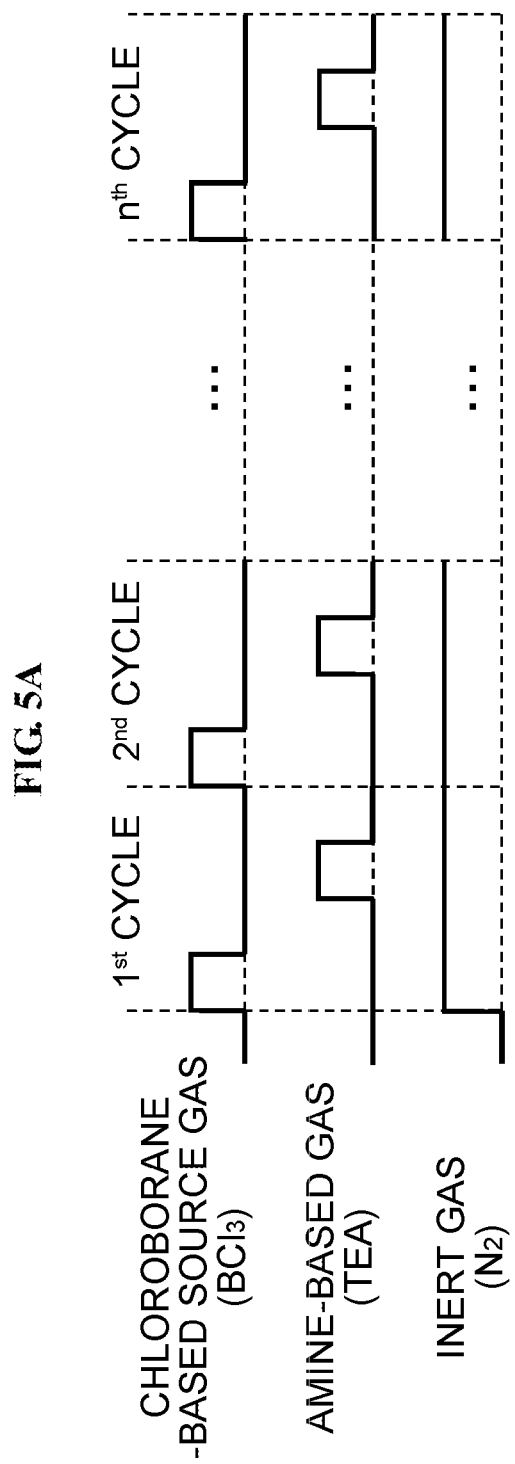

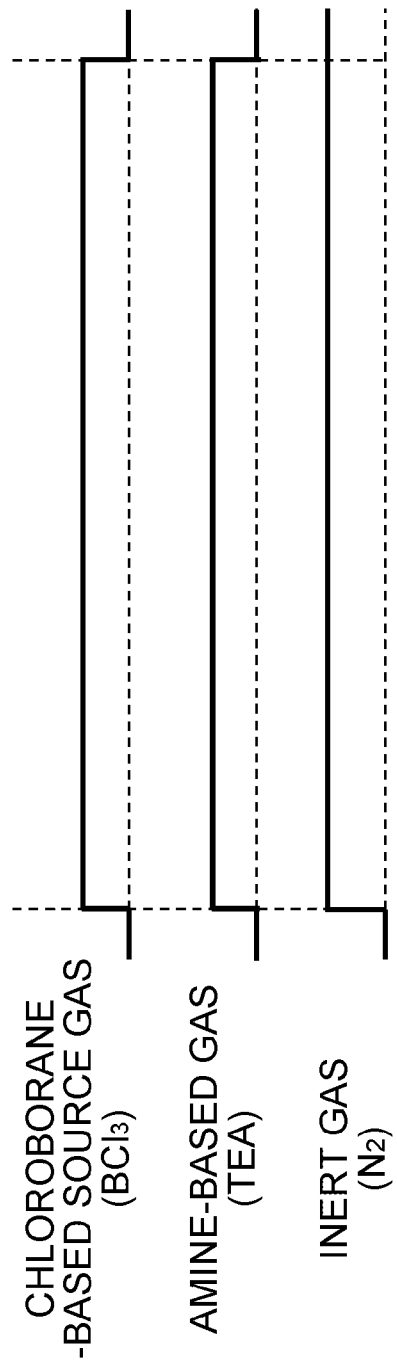

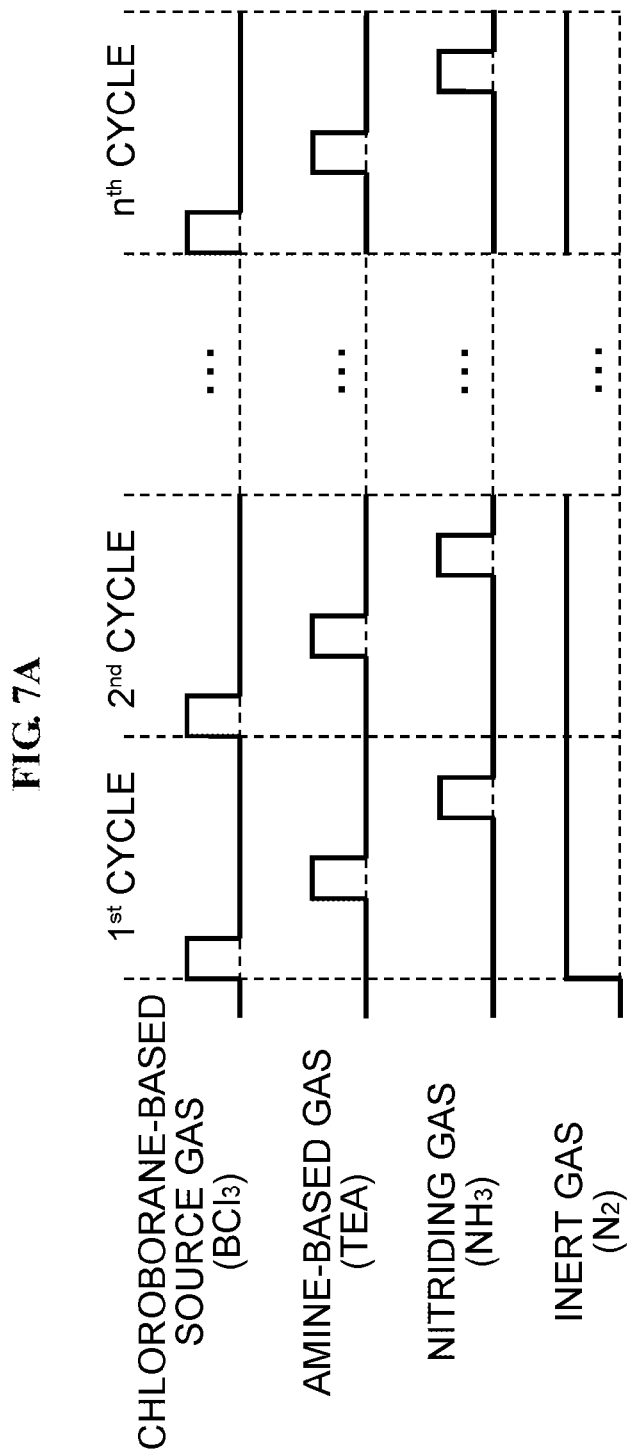

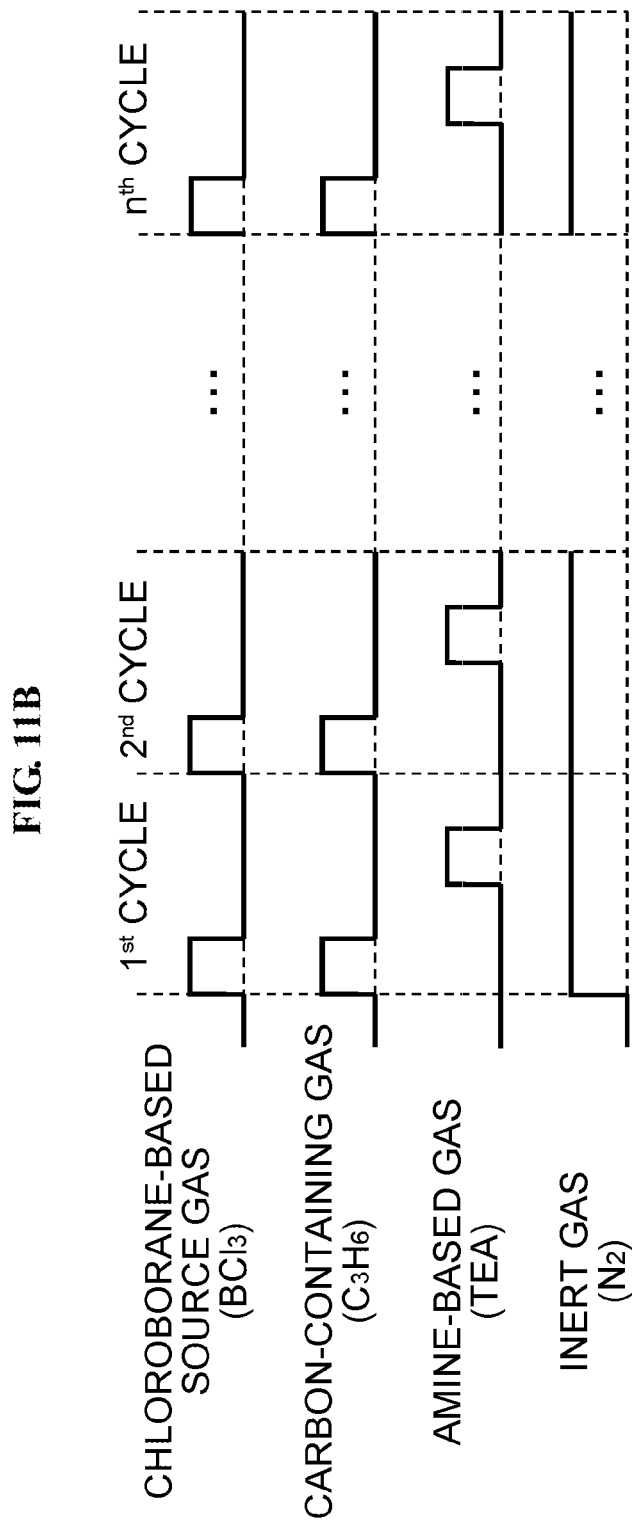

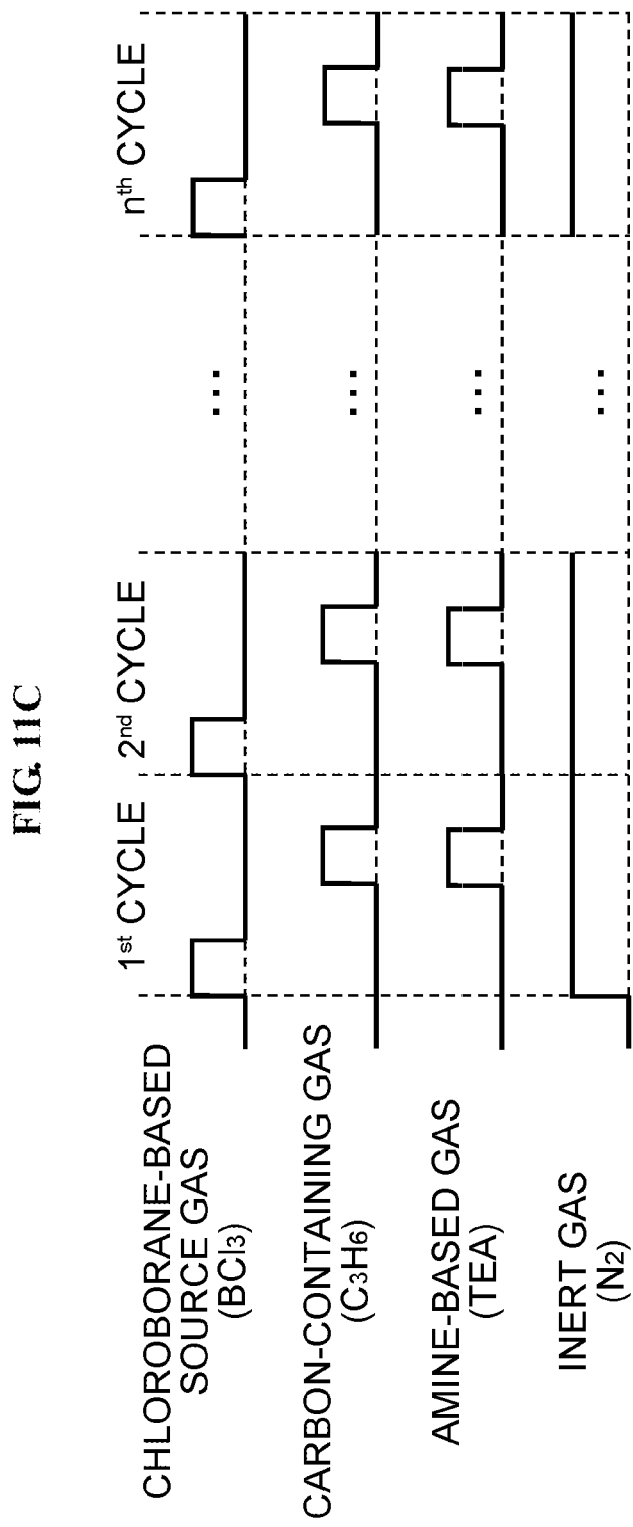

METHOD OF MANUFACTURING SEMICONDUCTOR DEVICE, SUBSTRATE PROCESSING APPARATUS AND NON-TRANSITORY COMPUTER-READABLE RECORDING MEDIUM

CROSS-REFERENCE TO RELATED PATENT APPLICATION

This U.S. non-provisional patent application claims priority under 35 U.S.C. §119 of Japanese Patent Application No. 2013-127264 filed on Jun. 18, 2013 in the Japanese Patent Office, the entire contents of which are hereby incorporated by reference.

BACKGROUND OF THE INVENTION

1. Field of the Invention

The present invention relates to a method of manufacturing a semiconductor device, which includes a process of forming a thin film on a substrate, a substrate processing apparatus and a recording medium.

2. Description of the Related Art

During a process of manufacturing a semiconductor device (device), a process of forming a boron nitride film (BN film) on a substrate such as a silicon wafer or the like may be performed. In addition, it has been known that the tolerance of a boron nitride (BN) film with respect to hydrogen fluoride (HF) can be improved when carbon (C) is contained in the boron nitride (BN) film.

SUMMARY OF THE INVENTION

A technique of alternately supplying three types of gases, i.e., a boron (B)-containing gas, a carbon (C)-containing gas and a nitrogen (N)-containing gas, to a substrate has been known as a technique of forming a boron carbonitride film (BCN film) by introducing carbon (C) into a boron nitride (BN) film. However, controlling the three types of gases is complicated, and film-forming productivity may decrease when the above-described technique is used. In addition, it may be difficult to set the concentration of carbon (C) in the BCN film to a predetermined concentration when the above-described technique is used.

It is an object of the present invention to increase the controllability of the concentration of carbon (C) contained in a boron carbonitride (BCN) film or a boron nitride (BN) film by increasing the productivity of forming the boron carbonitride (BCN) film or the boron nitride (BN) film.

According to one aspect of the present invention, there is provided a method of manufacturing a semiconductor device, including forming a film containing boron, carbon and nitrogen or a film containing boron and nitrogen on a substrate by performing, a predetermined number of times, a cycle including (a) supplying a source gas containing boron and a halogen element to the substrate and (b) supplying a reactive gas consisting of carbon, nitrogen and hydrogen to the substrate.

According to another aspect of the present invention, there is provided a substrate processing apparatus including:
a process chamber configured to accommodate a substrate;
a source gas supply system configured to supply a source gas containing boron and a halogen element into the process chamber;
a reactive gas supply system configured to supply a reactive gas consisting of carbon, nitrogen and hydrogen into the process chamber; and
a controller configured to control the source gas supply system and the reactive gas supply system to perform a formation of a film containing boron, carbon and nitrogen or a film containing boron and nitrogen on the substrate by performing, a predetermined number of times, a cycle including supplying the source gas to the substrate in the process chamber and supplying the reactive gas to the substrate in the process chamber.

According to another aspect of the present invention, there is provided a non-transitory computer-readable recording medium storing a program that causes a computer to perform a formation of a film containing boron, carbon and nitrogen or a film containing boron and nitride on a substrate by performing, a predetermined number of times, a cycle including supplying a source gas containing boron and a halogen element to the substrate and supplying a reactive gas consisting of carbon, nitrogen and hydrogen to the substrate.

BRIEF DESCRIPTION OF THE DRAWINGS

FIG. 5A illustrates gas supply timing in a film-forming sequence according to the first embodiment, and FIGS. 5B and 5C are modified examples of FIG. 5A.

FIGS. 7A and 7B are diagrams illustrating gas supply timing and plasma power supply timing in the first sequence according to the second embodiment, in which FIG. 7A illustrates an example of a non-plasma film forming sequence and FIG. 7B illustrates an example of a plasma film forming sequence.

FIGS. 9A and 9B are diagrams illustrating gas supply timing and plasma power supply timing in the second sequence according to the second embodiment, in which FIG. 9A illustrates an example of a non-plasma film forming sequence and FIG. 9B illustrates an example of a plasma film forming sequence.

FIGS. 11B and 11C are modified examples of FIG. 11A.

DETAILED DESCRIPTION OF THE PREFERRED EMBODIMENTS

First Embodiment of the Present Invention

Hereinafter, a first embodiment of the present invention will be described with reference to FIGS. 1 through 3.

(1) Structure of Substrate Processing Apparatus

Figure 1:
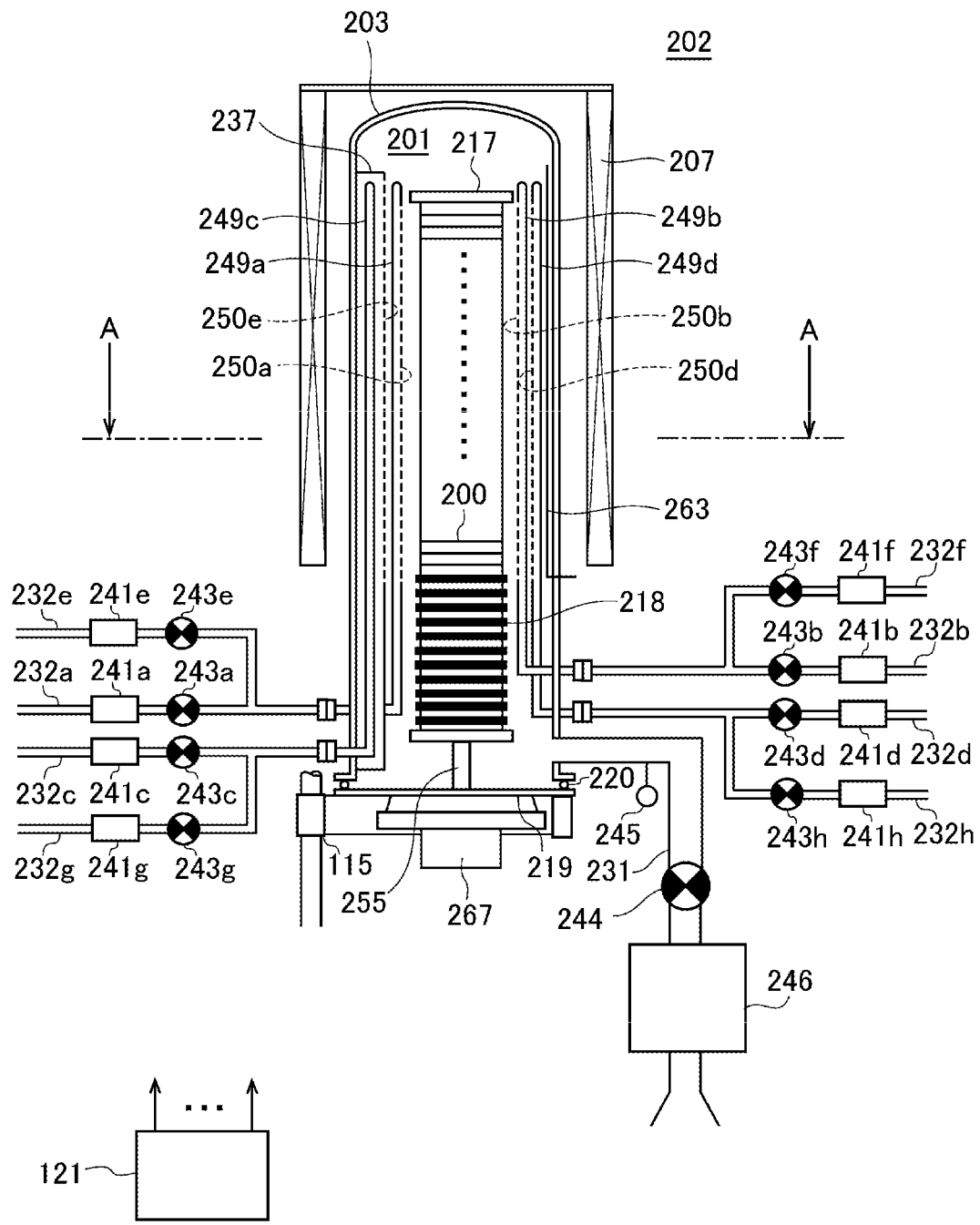
FIG. 1 is schematic diagram of a vertical process furnace of a substrate processing apparatus according to an exemplary embodiment of the present invention, in which a vertical cross-sectional view of a portion of the process furnace is illustrated.

As illustrated in FIG. 1, a process furnace 202 includes a heater 207 serving as a heating unit (heating mechanism). The heater 207 has a cylindrical shape and is vertically installed by being supported by a heater base (not shown) serving as a retaining plate. The heater 207 also acts as an activating mechanism (excitation unit) that activates a gas with heat as will be described below.

In the heater 207, a reaction tube 203 forming a reaction container (process container) in a concentric shape with the heater 207 is provided. The reaction tube 203 is formed of a heat-resistant material, e.g., quartz ($SiO_2$) or silicon carbide (SiC), and has a cylindrical shape, an upper end of which is closed and a lower end of which is open. A process chamber 201 is formed in a hollow tubular portion of the reaction tube 203, and configured to accommodate wafers 200 serving as substrates such that the wafers 200 are vertically arranged in a horizontal posture and in multiple stages using a boat 217 which will be described below.

In the process chamber 201, nozzles 249a through 249d are installed to pass through a lower portion of the reaction tube 203. Gas supply pipes 232a through 232d are connected to the nozzles 249a through 249d, respectively. As described above, the reaction tube 203 is configured for the four nozzles 249a through 249d and the four gas supply pipes 232a through 232d to be installed therein and to supply a plurality of gases (here, four types of gases) into the process chamber 201.

However, the process furnace 202 according to the present embodiment is not limited to the above-described embodiment. For example, a manifold formed of a metal may be installed below the reaction tube 203 to support the reaction tube 203, and the nozzles 249a through 249d may be installed to pass through sidewalls of the manifold. In this case, an exhaust pipe 231 which will be described below may be installed in the manifold. Alternatively, the exhaust pipe 231 may be installed below the reaction tube 203 rather than in the manifold formed of a metal. As described above, a furnace port portion of the process furnace 202 may be formed of a metal and the nozzles 249a through 249d may be installed at the furnace port portion formed of a metal.

Mass flow controllers (MFCs) 241a through 241d which are flow rate controllers (flow rate control units) and valves 243a through 243d which are opening/closing valves are installed at the gas supply pipes 232a through 232d sequentially from upstream ends, respectively. Gas supply pipes 232e through 232h are connected to the gas supply pipes 232a through 232d downstream from the valves 243a through 243d, respectively, to supply an inert gas. MFCs 241e through 241h which are flow rate controllers (flow rate control units) and valves 243e through 243h which are opening/closing valves are installed on the gas supply pipes 232e through 232h sequentially from upstream ends, respectively.

The nozzles 249a, 249b and 249d described above are connected to front end portions of the gas supply pipes 232a, 232b and 232d. As illustrated in FIG. 2, the nozzles 249a, 249b and 249d are installed in an arc-shaped space between inner walls of the reaction tube 203 and the wafers 200 to move upward from lower inner walls of the reaction tube 203 in a direction in which the wafers 200 are stacked. In other words, the nozzles 249a, 249b and 249d are installed along a wafer arrangement region in which the wafers 200 are arranged, in a region that horizontally surrounds the wafer arrangement region at sides of the wafer arrangement region. The nozzles 249a, 249b and 249d are configured as L-shaped long nozzles, and each includes a horizontal portion to pass through lower sidewalls of the reaction tube 203 and a vertical portion to vertically move at least from one end of the wafer arrangement region toward the other end thereof. A plurality of gas supply holes 250a, 250b and 250d are formed in side surfaces of the nozzles 249a, 249b and 249d to supply a gas. The gas supply holes 250a, 250b and 250d open toward a center of the reaction tube 203 to supply a gas toward the wafers 200. The gas supply holes 250a, 250b and 250d are formed from a lower portion of the reaction tube 203 to an upper portion thereof and each have the same opening area at the same opening pitch.

The nozzle 249c described above is connected to a front end portion of the gas supply pipe 232c. The nozzle 249c is installed in a buffer chamber 237 which is a gas dispersion space. The buffer chamber 237 is installed in the arc-shaped space between the inner walls of the reaction tube 203 and the wafers 200 and a region ranging from lower portions of the inner walls of the reaction tube 203 to upper portions of the inner walls of the reaction tube 203 in the direction in which the wafers 200 are stacked as illustrated in FIG. 2. That is, the buffer chamber 237 is installed along the wafer arrangement region and in the region that horizontally surrounds the wafer arrangement region at the sides of the wafer arrangement region. A plurality of gas supply holes 250e are formed in an end portion of a wall of the buffer chamber 237 adjacent to the wafers 200 to supply a gas. The gas supply holes 250e open toward the center of the reaction tube 203 to supply a gas toward the wafers 200. The gas supply holes 250e are formed from the lower portion of the reaction tube 203 to the upper portion thereof and each have the same opening area at the same opening pitch.

The nozzle 249c is installed at an end portion of the wall of the buffer chamber 237 opposite to the end portion of the wall of the buffer chamber 237 in which the gas supply holes 250e are formed to move upward in the direction in which the wafers 200 are stacked, along the lower portions of the inner walls of the reaction tube 203 to the upper portions thereof. That is, the nozzle 249c is installed along the wafer arrangement region in which the wafers 200 are arranged, in the region that horizontally surrounds the wafer arrangement region at sides of the wafer arrangement region. The nozzle 249c is configured as an L-shaped long nozzle and includes a horizontal portion to pass through the lower sidewalls of the reaction tube 203 and a vertical portion to vertically move at least from one end of the wafer arrangement region toward the other end thereof. A plurality of gas supply holes 250c are formed in a side surface of the nozzle 249c to supply a gas. The gas supply holes 250c open toward a center of the buffer chamber 237. The gas supply holes 250c are formed from the lower portion of the reaction tube 203 to the upper portion thereof, similar to the gas supply holes 250e. When a differential pressure between the inside of the buffer chamber 237 and the inside of the process chamber 201 is low, the opening areas and pitches of the gas supply holes 250c may be set to be the same from an upstream side (lower portion) of the gas supply holes 250c to a downstream side (upper portion) of the gas supply holes 250c. In addition, when the differential pressure between the inside of the buffer chamber 237 and the inside of the process chamber 201 is high, the opening areas of the gas supply holes 250c may be gradually increased from the upstream side to the downstream side or the opening pitches of the gas supply holes 250c may be gradually reduced from the upstream side to the downstream side.

By controlling the opening areas or pitches of the respective gas supply holes 250c from the upstream side to the downstream side as described above, gases having different flow velocities and substantially the same flow rate may be emitted via the respective gas supply holes 250c. In addition, different flow velocities of gases in the buffer chamber 237 may be equalized by introducing the gases emitted via the respective gas supply holes 250c into the buffer chamber 237. The speeds of particles of the gases emitted into the buffer chamber 237 via the respective gas supply holes 250c decrease in the buffer chamber 237 and are then emitted into the process chamber 201 via the gas supply holes 250e. The flow rates and velocities of the gases emitted into the buffer chamber 237 via the respective gas supply holes 250c are equalized when the gases are emitted into the process chamber 201 via the respective gas supply holes 250e.

As described above, in the present embodiment, a gas is transferred via the nozzles 249a through 249d and the buffer chamber 237 arranged in the arc shape that is a vertically long space defined by the inner walls of the reaction tube 203 and ends (circumferential surfaces) of the stacked wafers 200, i.e., a cylindrical shape. In addition, a gas is first discharged into the reaction tube 203 near the wafers 200 from the gas supply holes 250a through 250e that open in the respective nozzles 249a through 249d and the buffer chamber 237. A gas flows mainly in the reaction tube 203 to be parallel with surfaces of the wafers 200, i.e., in a horizontal direction. Due to the structure described above, a gas may be evenly supplied to the wafers 200 and a thin film may be formed on the wafers 200 to a uniform thickness. In addition, a gas flowing along surfaces of the wafers 200, i.e., a residual gas remaining after a reaction, flows in a direction of an exhaust mechanism, i.e., the exhaust pipe 231 which will be described below. However, the direction in which the residual gas flows may be appropriately defined according to the location of the exhaust mechanism and is not limited to the vertical direction.

A source gas containing boron (B) and a halogen element, e.g., a chloroborane-based source gas which is a source gas containing at least boron (B) and chlorine (Cl), is supplied into the process chamber 201 from the gas supply pipe 232a via the MFC 241a, the valve 243a and the nozzle 249a.

The chloroborane-based source gas refers to a gaseous chloroborane-based source, e.g., a gas obtained by vaporizing a chloroborane-based source that is in a liquid state at room temperature and normal pressure, or a chloroborane-based source that is in a gas state at room temperature and normal pressure. The chloroborane-based source is a borane-based source containing a chloro group as a halogen group, and is a source containing at least boron (B) and chlorine (Cl). The chloroborane-based source may be understood as a type of halide. The borane-based source is not limited to a source containing borane (boron hydride), such as monoborane ($BH_3$) or diborane ($B_2H_6$), and should be understood as a general term of a source containing a borane compound (borane derivative) having a form in which a hydrogen atom of borane is substituted with another element. When the term 'source' is used in the present disclosure, it may be understood as a liquid source in a liquid state, a source gas in a gas state, or both of them. When the term 'chloroborane-based source' is used in the present disclosure, it may be understood as a chloroborane-based source in a liquid state, a chloroborane-based source in a gas state, or both of them. For example, trichloroborane ($BCl_3$) may be used as a chloroborane-based source. Trichloroborane ($BCl_3$) is in a gas state at room temperature and normal pressure. Thus, trichloroborane ($BCl_3$) may be supplied as a source gas without vaporizing a liquid source using a vaporization system such as a vaporizer or a bubbler. In this case, when a liquid source that is in a liquid state at room temperature and normal pressure is used as a liquid source, the liquid source is vaporized using the vaporization system such as a vaporizer or a bubbler and supplied as a source gas.

For example, an amine-containing gas, i.e., an amine-based gas, is supplied as a reactive gas containing the three elements carbon (C), nitrogen (N) and hydrogen (H) into the process chamber 201 from the gas supply pipe 232b via the MFC 241b, the valve 243b and the nozzle 249b.

The amine-based gas refers to a gaseous amine, e.g., a gas obtained by vaporizing an amine that is in a liquid state at room temperature and normal pressure or an amine-group-containing gas such as an amine that is in a gas state at room temperature and normal pressure. The amine-based gas contains an amine, such as ethylamine, methylamine, propylamine, isopropylamine, butylamine, isobutylamine, etc. An amine is a general term for a compound in which a hydrogen (H) atom of ammonia ($NH_3$) is substituted with a hydrocarbon-group such as an alkyl group, etc. An amine contains a hydrocarbon-group such as an alkyl group as a ligand containing a carbon (C) atom. The amine-based gas contains the three elements carbon (C), nitrogen (N) and hydrogen (H), and does not contain boron (B). Thus, the amine-based gas may be called a boron-free gas. In addition, the amine-based gas does not contain boron (B) or a metal, and thus may also be called as a boron-and-metal-free gas. The amine-based gas may also be called a nitrogen-containing gas (nitrogen source), a carbon-containing gas (carbon source), or a hydrogen-containing gas. The amine-based gas may also be understood as a material consisting of only the three elements carbon (C), nitrogen (N) and hydrogen (H) that constitute an amine group. When the term 'amine' is used in the present disclosure, it may be understood as an amine that is in a liquid state, an amine-based gas that is in a gas state, or both of them. For example, triethylamine [$(C_2H_5)_3N$, abbreviated as TEA] gas having an empirical formula in which the number of ligands (ethyl groups) containing carbon (C) atoms per molecule is three and the number of carbon (C) atoms is greater than that of nitrogen (N) atoms may be used as the amine-based gas. When an amine that is in a liquid state at room temperature and normal pressure, e.g., TEA, is used, the amine that is in the liquid state is vaporized using a vaporization system such as a vaporizer or a bubbler and is then supplied as a reactive gas (TEA gas).

A nitriding gas (nitrogen-containing gas) is supplied into the process chamber 201 from the gas supply pipe 232c via the MFC 241c, the valve 243c, the nozzle 249c and the buffer chamber 237. For example, ammonia ($NH_3$) gas may be used as the nitriding gas.

For example, a hydrocarbon-based gas is supplied as a gas containing carbon (C) (carbon-containing gas) into the process chamber 201 from the gas supply pipe 232d via the MFC 241d, the valve 243d and the nozzle 249d. For example, propylene ($C_3H_6$) gas may be used as the carbon-containing gas.

For example, nitrogen ($N_2$) gas is supplied as an inert gas into the process chamber 201 from the gas supply pipes 232e through 232h via the MFCs 241e through 241h, the valves 243e through 243h, the gas supply pipes 232a through 232d, the nozzles 249a through 249d and the buffer chamber 237.

When the gases described above are supplied via the gas supply pipes, a source gas supply system that supplies a source gas containing boron (B) and halogen elements, i.e., a chloroborane-based source gas supply system, mainly includes the gas supply pipe 232a, the MFC 241a and the valve 243a. The nozzle 249a may be further included in the chloroborane-based source gas supply system. The source gas supply system may also be referred to as a source supply system, and the chloroborane-based source gas supply system may also be referred to as a chloroborane-based source supply system.

A reactive gas supply system that supplies a reactive gas containing the three elements carbon (C), nitrogen (N) and hydrogen (H), i.e., an amine-based gas supply system, mainly includes the gas supply pipe 232b, the MFC 241b and the valve 243b. The nozzle 249b may be further included in the amine-based gas supply system. The amine-based gas supply system is also simply referred to as an amine supply system.

A nitriding gas (nitrogen-containing gas) supply system mainly includes the gas supply pipe 232c, the MFC 241c and the valve 243c. The nozzle 249c and the buffer chamber 237 may be further included in the nitriding gas supply system.

A hydrocarbon-based gas supply system serving as a carbon-containing gas supply system mainly includes the gas supply pipe 232d, the MFC 241d and the valve 243d. The nozzle 249d may be further included in the hydrocarbon-based gas supply system.

An inert gas supply system mainly includes the gas supply pipes 232e through 232h, the MFCs 241e through 241h and the valves 243e through 243h. The nozzles 249a through 249d and the buffer chamber 237 may be further included in the inert gas supply system downstream from the interfaces between the gas supply pipes 232a through 232d and the gas supply pipes 232e through 232h. The inert gas supply system may act as a purge gas supply system.

Figure 2:
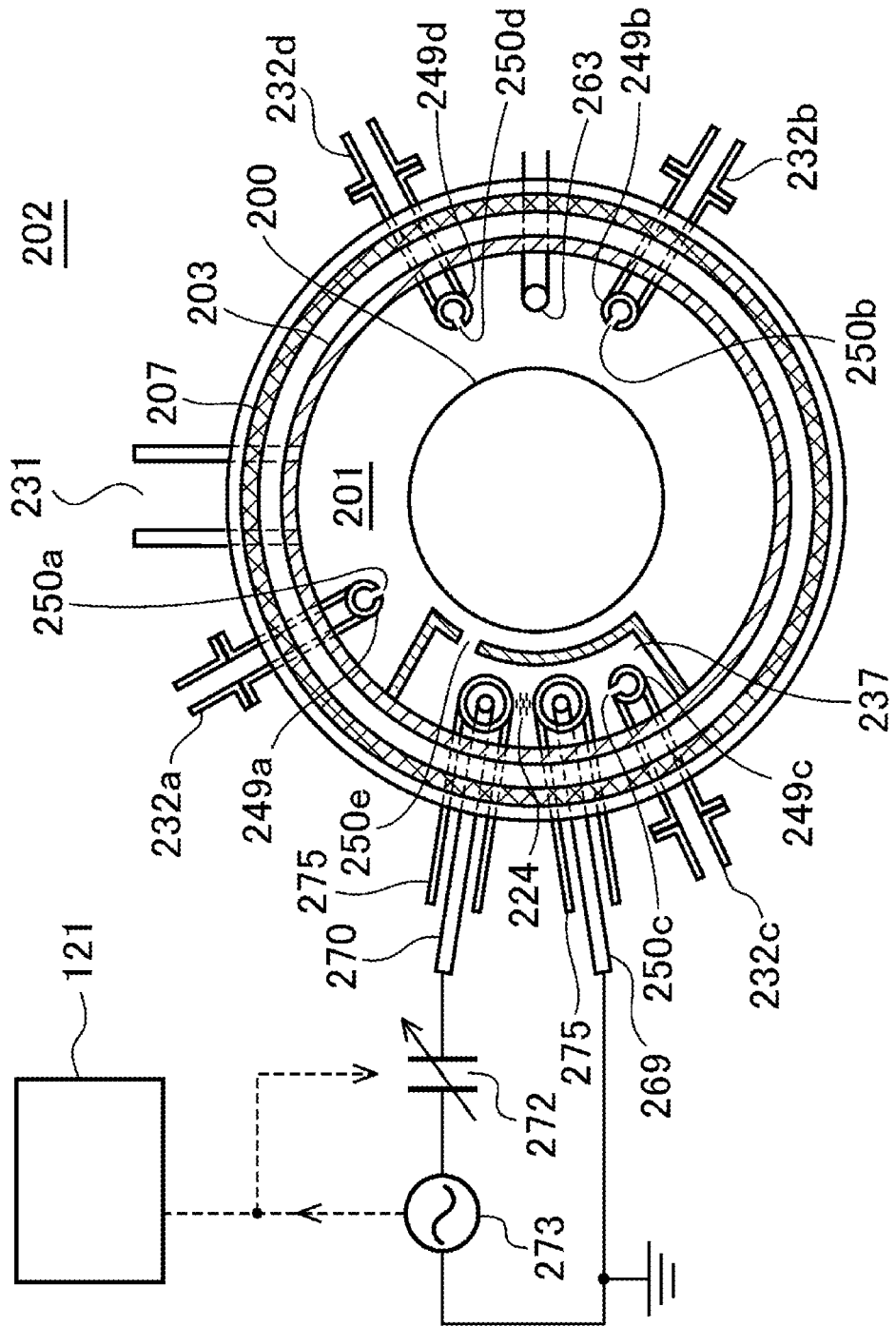
FIG. 2 is a schematic diagram of a vertical process furnace of a substrate processing apparatus according to an exemplary embodiment of the present invention, in which a cross-sectional view taken along line A-A of the portion of the process furnace of FIG. 1 is illustrated.

As illustrated in FIG. 2, in the buffer chamber 237, two rod-shaped electrodes 269 and 270 each formed of a conductor and having a slender and long structure are provided from the lower portion of the reaction tube 203 to the upper portion thereof, in the direction in which the wafers 200 are stacked. The rod-shaped electrodes 269 and 270 are installed in parallel with the nozzle 249c. Each of the rod-shaped electrodes 269 and 270 is protected by being covered with an electrode protection pipe 275 from an upper portion to a lower portion thereof. One of the rod-shaped electrodes 269 and 270 is connected to a high frequency power source 273 via an impedance matching unit 272, and the other electrode is connected to the ground that is a reference electric potential. Plasma is generated in a plasma generating region 224 between the rod-shaped electrodes 269 and 270 by supplying high frequency power between the rod-shaped electrodes 269 and 270 from the high frequency power source 273 via the impedance matching unit 272. A plasma source serving as a plasma generator (plasma generation unit) mainly includes the rod-shaped electrodes 269 and 270 and the electrode protection pipe 275. The impedance matching unit 272 and the high frequency power source 273 may be further included in the plasma source. The plasma source acts as an activating mechanism (excitation unit) that activates (excites) a gas with plasma as will be described below.

The electrode protection pipe 275 is configured such that the rod-shaped electrodes 269 and 270 may be inserted into the buffer chamber 237 in a state in which the rod-shaped electrodes 269 and 270 are isolated from an atmosphere in the buffer chamber 237. When the concentration of oxygen in the electrode protection pipe 275 is substantially the same as that of oxygen in external air (atmosphere), the rod-shaped electrodes 269 and 270 inserted into the electrode protection pipe 275 are oxidized by heat from the heater 207. Thus, the concentration of the oxygen in the electrode protection pipe 275 may be reduced by filling the inside of the electrode protection pipe 275 beforehand with an inert gas such as nitrogen gas or by purging the inside of the electrode protection pipe 275 with an inert gas such as nitrogen gas through an inert gas purging mechanism, thereby preventing the rod-shaped electrodes 269 and 270 from being oxidized.

The exhaust pipe 231 is installed at the reaction tube 203 to exhaust an atmosphere in the process chamber 201. A vacuum pump 246 serving as a vacuum exhaust device is connected to the exhaust pipe 231 via a pressure sensor 245 serving as a pressure detector (pressure detection unit) that detects pressure in the process chamber 201 and an auto pressure controller (APC) valve 244 serving as a pressure adjustor (pressure adjustment unit). The APC valve 244 is configured to perform or suspend vacuum-exhaust in the process chamber 201 by opening/closing the APC valve 244 while the vacuum pump 246 is operated, and to adjust pressure in the process chamber 201 by controlling the degree of opening the APC valve 244 based on pressure information detected by the pressure sensor 245 while the vacuum pump 246 is operated. An exhaust system mainly includes the exhaust pipe 231, the APC valve 244 and the pressure sensor 245. The vacuum pump 246 may be further included in the exhaust system.

Below the reaction tube 203, a seal cap 219 is installed as a furnace port lid that may air-tightly close a lower end aperture of the reaction tube 203. The seal cap 219 is configured to abut a lower end of the reaction tube 203 in a vertical direction from a lower portion thereof. The seal cap 219 is formed of a metal, such as stainless use steel (SUS), and has a disk shape. An O-ring 220 serving as a seal member that abuts the lower end of the reaction tube 203 is formed on an upper surface of the seal cap 219. A rotating mechanism 267 that rotates the boat 217 (which will be described below) is installed at a side of the seal cap 219 opposite to the process chamber 201. A rotation shaft 255 of the rotating mechanism 267 is connected to the boat 217 while passing through the seal cap 219. The rotating mechanism 267 is configured to rotate the wafers 200 by rotating the boat 217. The seal cap 219 is configured to be vertically moved by a boat elevator 115 that is a lifting mechanism vertically installed outside the reaction tube 203. The boat elevator 115 is configured to load the boat 217 into or unload the boat 217 from the process chamber 201 by moving the seal cap 219 upward/downward. The boat elevator 115 is configured as a transfer device (transfer mechanism) that transfers the boat 217, i.e., the wafers 200, inside or outside the process chamber 201.

The boat 217 serving as a substrate supporter is configured to support a plurality of wafers 200 (e.g., 100 to 150 wafers) in a state in which the wafers 200 are vertically arranged in a concentrically multilayered structure in a horizontal posture, i.e., such that the wafers 200 are arranged to be spaced from one another. The boat 217 is formed of a heat-resistant material, e.g., quartz or silicon carbide (SiC). Below the boat 217, insulating plates 218 formed of a heat-resistant material, e.g., quartz or silicon carbide (SiC), are supported in a multilayered structure and a horizontal posture to prevent heat generated from the heater 207 from being transferred to the seal cap 219. However, embodiments of the present invention are not limited thereto. For example, an insulating cylinder including a cylindrical member formed of a heat-resistance material such as quartz or silicon carbide (SiC) may be installed below the boat 217 instead of the insulating plates 218.

In the reaction tube 203, a temperature sensor 263 is installed as a temperature detector. The temperature sensor 263 is configured to control an amount of current to be supplied to the heater 207 based on temperature information detected by the temperature sensor 263, so that the temperature in the process chamber 201 may have a desired temperature distribution. The temperature sensor 263 has an L shape similar to the nozzles 249a through 249d, and is installed along an inner wall of the reaction tube 203.

Figure 3:
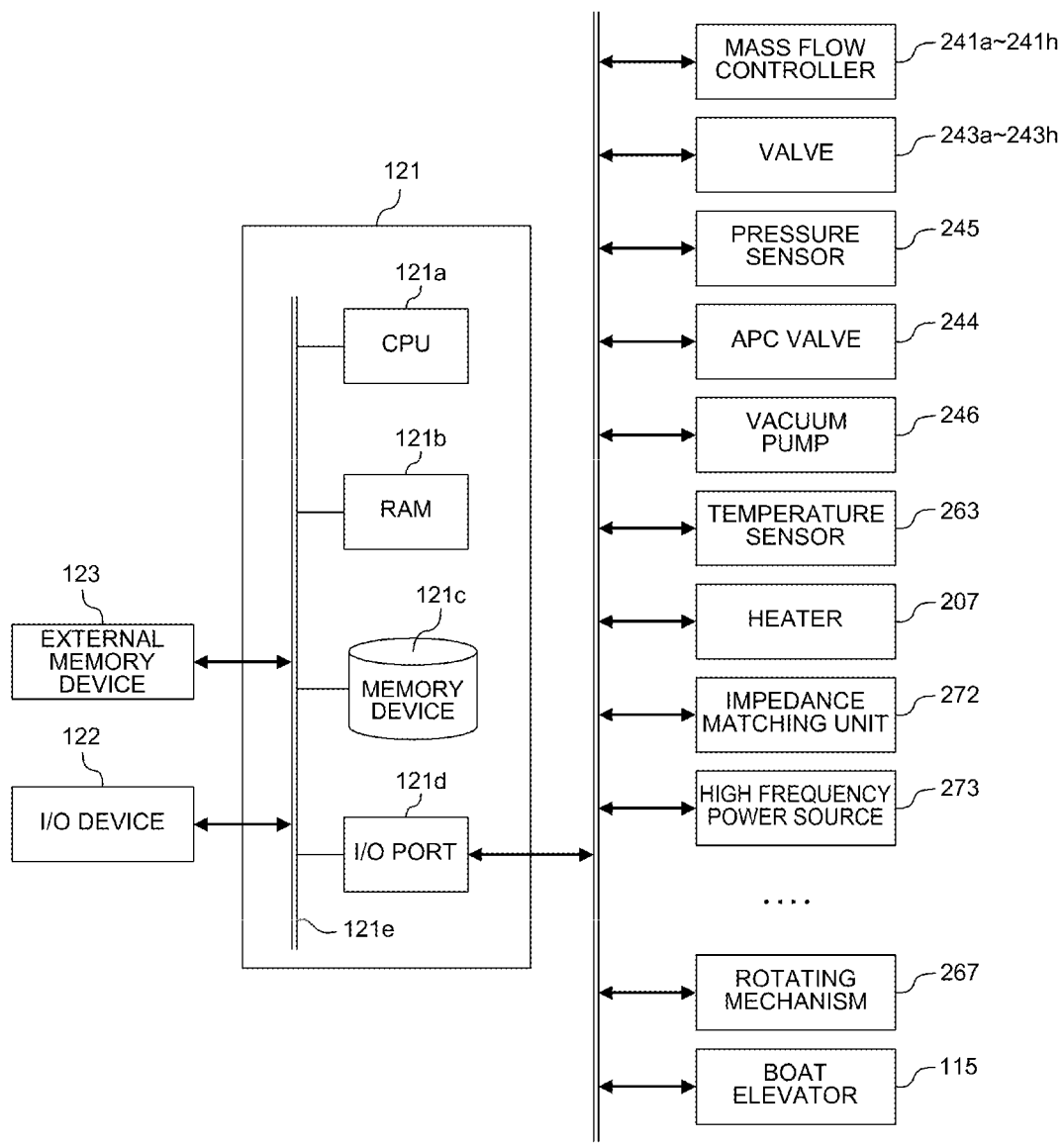
FIG. 3 is a schematic diagram of a controller of a substrate processing apparatus according to an exemplary embodiment of the present invention, in which a block diagram of a control system of the controller is illustrated.

As illustrated in FIG. 3, a controller 121 which is a control unit (control means) is configured as a computer including a central processing unit (CPU) 121a, a random access memory (RAM) 121b, a memory device 121c and an input/output (I/O) port 121d. The RAM 121b, the memory device 121c and the I/O port 121d are configured to exchange data with the CPU 121a via an internal bus 121e. An I/O device 122 configured, for example, as a touch panel or the like is connected to the controller 121.

The memory device 121c is configured, for example, as a flash memory, a hard disk drive (HDD), or the like. In the memory device 121c, a control program for controlling an operation of a substrate processing apparatus, a process recipe including the order or conditions of substrate processing which will be described below, and the like is stored to be readable. The process recipe is a combination of sequences of a substrate processing process which will be described below to obtain a desired result when the sequences are performed by the controller 121, and acts as a program. Hereinafter, the process recipe, the control program, etc. will be referred to together simply as a 'program.' Also, when the term 'program' is used in the present disclosure, it may be understood as including only a process recipe, only a control program, or both of the process recipe and the control program. The RAM 121b is configured as a work area in which a program or data read by the CPU 121a is temporarily retained.

The I/O port 121d is connected to the MFCs 241a through 241h, the valves 243a through 243h, the pressure sensor 245, the APC valve 244, the vacuum pump 246, the heater 207, the temperature sensor 263, the high frequency power source 273, the impedance matching unit 272, the rotating mechanism 267, the boat elevator 115, etc.

The CPU 121a is configured to read and execute the control program from the memory device 121c and to read the process recipe from the memory device 121c according to a manipulation command received via the I/O device 122. According to the read process recipe, the CPU 121a is configured to control flow rates of various gases via the MFCs 241a through 241h; control opening/closing of the valves 243a through 243h; control the degree of pressure by opening/closing the APC valve 244 based on the pressure sensor 245 using the APC valve 244; control driving/suspending of the vacuum pump 246; control temperature using the heater 207 based on the temperature sensor 263; control supply of power to the high frequency power source 273, control adjustment of impedance using the impedance matching unit 272, control the rotation and rotation speed of the boat 217 using the rotating mechanism 267; control upward/downward movement of the boat 217 using the boat elevator 115, etc.

The controller 121 is not limited to a dedicated computer and may be configured as a general-purpose computer. For example, the controller 121 according to the present embodiment may be configured by preparing an external memory device 123 storing a program as described above, e.g., a magnetic disk (e.g., a magnetic tape, a flexible disk, a hard disk, etc.), an optical disc (e.g., a compact disc (CD), a digital versatile disc (DVD), etc.), a magneto-optical (MO) disc, or a semiconductor memory (e.g., a Universal Serial Bus (USB) memory, a memory card, etc.), and then installing the program in a general-purpose computer using the external memory device 123. However, means for supplying a program to a computer are not limited to using the external memory device 123. For example, a program may be supplied to a computer using communication means, e.g., the Internet or an exclusive line, without using the external memory device 123. The memory device 121c or the external memory device 123 may be configured as a non-transitory computer-readable recording medium. Hereinafter, the memory device 121c and the external memory device 123 may also be referred to together simply as a 'recording medium.' When the term 'recording medium' is used in the present disclosure, it may be understood as only the memory device 121c, only the external memory device 123, or both the memory device 121c and the external memory device 123.

(2) Substrate Processing Process

Next, an example of a sequence of forming a thin film on a substrate using the process furnace of the substrate processing apparatus described above will be described as a process included in a process of manufacturing a semiconductor device (device). In the following description, operations of constitutional elements of the substrate processing apparatus are controlled by the controller 121.

In a film-forming sequence according to the present embodiment, a cycle including a process of supplying a source gas containing the elements boron (B) and halogen to a substrate and a process of supplying a reactive gas containing the three elements carbon (C), nitrogen (N) and hydrogen (H) to the substrate is performed a predetermined number of times to form either a film containing boron (B), carbon (C) and nitrogen (N) (hereinafter referred to as a BCN film) or a film containing boron (B) and nitrogen (N) (hereinafter referred to as a BN film) on the substrate.

In the process of supplying the source gas, a first layer containing the elements boron (B) and halogen is formed. In the process of supplying the reactive gas, the first layer containing the elements boron (B) and halogen reacts with the reactive gas to form a second layer containing boron (B), carbon (C) and nitrogen (N).

Here, the performing of the cycle including the process of supplying the source gas and the process of supplying the reactive gas the predetermined number of times means performing once or a plurality of times a cycle in which the process of supplying the source gas and the process of supplying the reactive gas are simultaneously or alternately performed. That is, it means performing the cycle at least once. In other words, it means that the cycle in which the process of supplying the source gas and the process of supplying the reactive gas are simultaneously or alternately performed is performed once or is repeatedly performed a plurality of times. However, the cycle is preferably performed a plurality of times.

The film-forming sequence according to the present embodiment will now be described with reference to FIGS. 4 and 5A.

Figure 4:
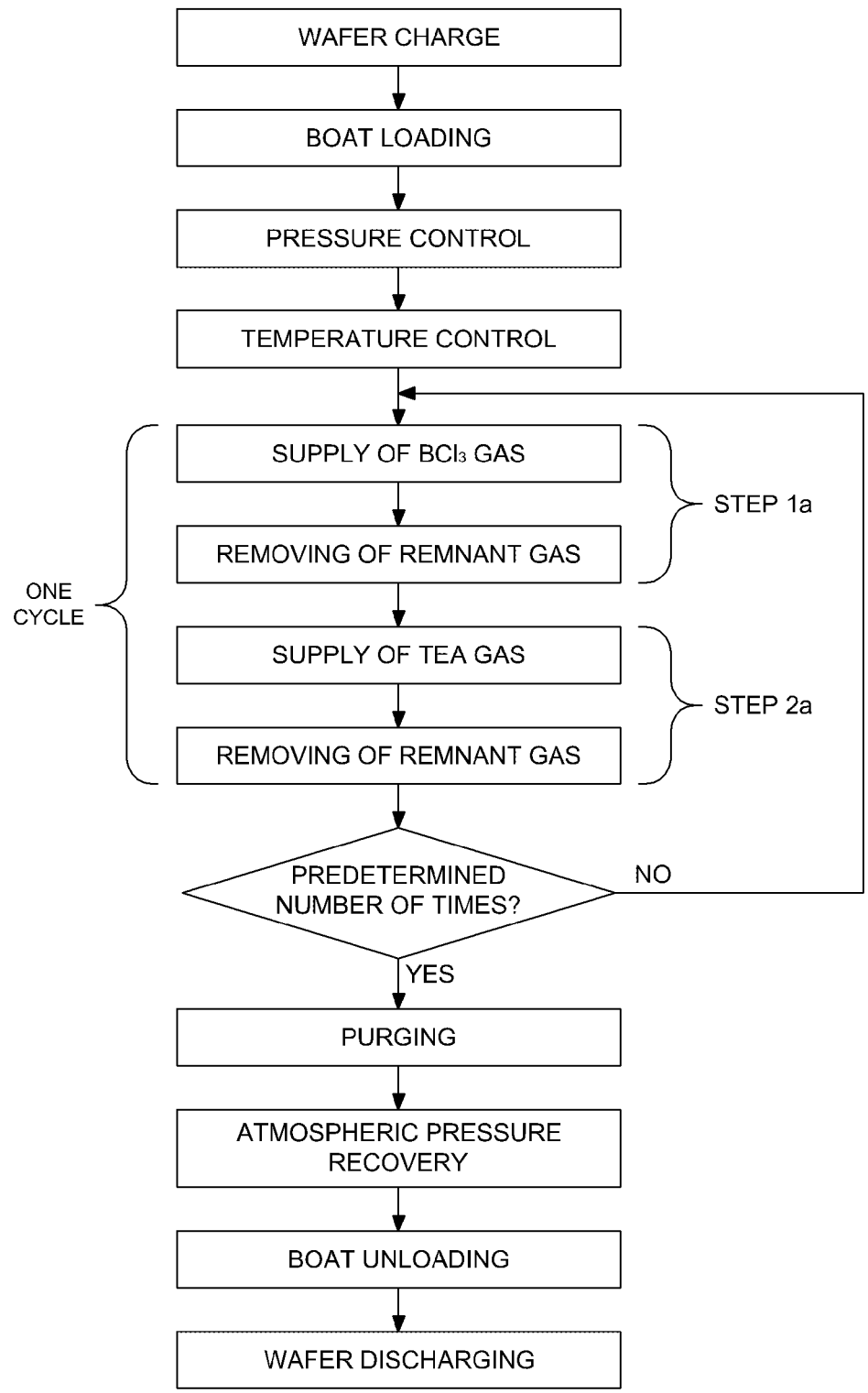
FIG. 4 illustrates a film-forming flow according to a first embodiment of the present invention.

In the film-forming sequences illustrated in FIGS. 4 and 5A, a BCN film is formed on a wafer 200 by performing a predetermined number of times a cycle including a process of supplying a chloroborane-based source gas ($BCl_3$ gas) as a source gas containing the elements boron (B) and halogen (Cl) to the wafer 200 and a process of supplying an amine-based gas (TEA gas) as a reactive gas containing the three elements carbon (C), nitrogen (N) and hydrogen (H) to the wafer 200.

FIGS. 4 and 5A illustrate cases in which the process of supplying the chloroborane-based source gas and the process of supplying the amine-based gas are alternately performed a predetermined number of times.

When the term 'wafer' is used in the present disclosure, it should be understood as either the wafer itself, or both the wafer and a stacked structure (assembly) including a layer/film formed on the wafer (i.e., the wafer and the layer/film formed thereon may also be referred to collectively as the 'wafer'). In addition, when the expression 'surface of the wafer' is used in the present disclosure, it should be understood as either a surface (exposed surface) of the wafer itself or a surface of a layer/film formed on the wafer, i.e., an uppermost surface of the wafer as a stacked structure.

Thus, in the present disclosure, the expression 'specific gas is supplied to a wafer' should be understood to mean that the specific gas is directly supplied to a surface (exposed surface) of the wafer or that the specific gas is supplied to a surface of a layer/film on the wafer, i.e., on the uppermost surface of the wafer as a stacked structure. In addition, in the present disclosure, the expression 'a layer (or film) is formed on the wafer' should be understood to mean that the layer (or film) is directly formed on a surface (exposed surface) of the wafer itself or that the layer (or film) is formed on a layer/film on the wafer, i.e., on the uppermost surface of the wafer as a stacked structure.

Also, in the present disclosure, the term 'substrate' has the same meaning as the term 'wafer.' Thus, the term 'wafer' may be used interchangeably with the term 'substrate.'

(Wafer Charging and Boat Loading)

When a plurality of wafers 200 are placed in the boat 217 (wafer charging), the boat 217 supporting the plurality of wafers 200 is lifted by the boat elevator 115 and loaded into the process chamber 201 (boat loading), as illustrated in FIG. 1. In this state, the lower end of the reaction tube 203 is air-tightly closed by the seal cap 219 via the O-ring 220.

(Pressure & Temperature Control)

The inside of the process chamber 201 in which the wafers 200 are present is vacuum-exhausted to a desired pressure (degree of vacuum) by the vacuum pump 246. In this case, the inner pressure of the process chamber 201 is measured by the pressure sensor 245, and the APC valve 244 is feedback-controlled based on information regarding the measured pressure (pressure control). The vacuum pump 246 is continuously operated at least until processing of the wafers 200 is completed. In addition, the wafers 200 in the process chamber 201 are heated to a desired temperature by the heater 207. In this case, an amount of current supplied to the heater 207 is feedback-controlled based on temperature information detected by the temperature sensor 263, so that the inside of the process chamber 201 may have a desired temperature distribution (temperature control). The heating of the inside of the process chamber 201 by the heater 207 is continuously performed at least until the processing of the wafers 200 is completed. Then, rotation of the boat 217 and the wafers 200 by the rotating mechanism 267 begins. In addition, the rotation of the boat 217 and the wafers 200 by the rotating mechanism 267 is continuously performed at least until the processing of the wafers 200 is completed.

(Process of Forming a BCN Film)

Then, the following two steps, i.e., steps 1a and 2a, are sequentially performed.

[Step 1a] (Supply of $BCl_3$ Gas)

The valve 243a is opened to supply $BCl_3$ gas into the gas supply pipe 232a. The flow rate of the $BCl_3$ gas is controlled by the MFC 241a. The $BCl_3$ gas, the flow rate of which is controlled, is supplied into the process chamber 201 from the gas supply holes 250a and exhausted from the exhaust pipe 231. In this case, the $BCl_3$ gas is supplied to the wafers 200. At the same time, the valve 243e is opened to supply an inert gas such as $N_2$ gas into the gas supply pipe 232e. The flow rate of the $N_2$ gas is controlled by the MFC 241e, and the $N_2$ gas, the flow rate of which is controlled, is supplied into the process chamber together with the $BCl_3$ gas and exhausted from the exhaust pipe 231.

In this case, in order to prevent the $BCl_3$ gas from flowing into the second nozzles 249b through 249d and the buffer chamber 237, the valves 243f through 243h are opened to supply $N_2$ gas into the gas supply pipes 232f through 232h. The $N_2$ gas is supplied into the process chamber 201 via the gas supply pipes 232b through 232d, the nozzles 249b through 249d and the buffer chamber 237, and exhausted from the exhaust pipe 231.

In this case, the inner pressure of the process chamber 201 is set to range, for example, from 1 to 13,300 Pa, and preferably from 20 to 1,330 Pa, by appropriately controlling the APC valve 244. The supply flow rate of the $BCl_3$ gas controlled by the MFC 241a is set to range, for example, from 1 to 2,000 sccm, and preferably from 1 to 1,000 sccm. The supply flow rates of the $N_2$ gas controlled by the respective MFCs 241e through 241h are set to range, for example, from 100 to 10,000 sccm. A duration for which the $BCl_3$ gas is supplied to the wafers 200, i.e., a gas supply time (gas irradiation time), is set to range, for example, from 1 to 120 seconds, and preferably 1 to 60 seconds. In this case, the temperature of the heater 207 is set such that the temperature of the wafers 200 ranges, for example, from 250° C. to 700° C., preferably from 300° C. to 650° C., and more preferably from 350° C. to 600° C.

When the temperature of the wafers 200 is less than 250° C., it is difficult for $BCl_3$ to be chemically adsorbed onto the wafers 200 and a practical film-forming rate may thus not be achieved. This problem may be overcome by setting the temperature of the wafers 200 to be 250° C. or more. In addition, when the temperature of the wafers 200 is controlled to be 300° C. or more or 350° C. or more, $BCl_3$ may be more sufficiently adsorbed onto the wafers 200 and a more sufficient film-forming rate can be achieved.

When the temperature of the wafers 200 is greater than 700° C., a chemical vapor deposition (CVD) reaction becomes stronger (gas-phase reaction is dominant), and film thickness uniformity is likely to be degraded and may thus be difficult to control. When the temperature of the wafers 200 is controlled to be 700° C. or less, the film thickness uniformity may be prevented from being degraded and thus be controlled.

In particular, when the temperature of the wafers 200 is controlled to be 650° C. or less or 600° C. or less, a surface reaction becomes dominant, and the film thickness uniformity may be easily achieved and thus be easily controlled.

Thus, the temperature of the wafers 200 may be controlled to range from 250 to 700° C., preferably from 300 to 650° C., and more preferably from 350 to 600° C.

Under the conditions described above, the $BCl_3$ gas is supplied to the wafers 200 to form a boron-containing layer containing chlorine (Cl) as a first layer on the wafer 200 (an underlying film formed on the wafer 200) to a thickness of less than one atomic layer to several atomic layers. The first layer may be an adsorption layer of the BCl$_3$ gas, a boron layer containing chlorine (Cl), or both of these layers.

Here, the boron layer containing chlorine (Cl) generally refers to any layers including a continuous layer formed of boron (B) and containing chlorine (Cl), a discontinuous layer formed of boron (B) and containing chlorine (Cl) and a boron (B) thin film containing chlorine (Cl) and formed by overlapping the continuous layer and the discontinuous layer. The continuous layer formed of boron (B) and containing chlorine (Cl) may also be referred to as a boron thin film containing chlorine (Cl). Boron (B) used to form the boron layer containing chlorine (Cl) should be understood as including not only boron (B) from which a bond with chlorine (Cl) is not completely broken but also boron (B) from which the bond with chlorine (Cl) is completely broken.

Examples of the adsorption layer of BCl$_3$ gas include not only a chemical adsorption layer containing continuous gas molecules of the BCl$_3$ gas but also a chemical adsorption layers including discontinuous gas molecules of the BCl$_3$ gas. That is, the adsorption layer of the BCl$_3$ gas contains a chemical adsorption layer formed of BCl$_3$ molecules to a thickness of one molecular layer or less than one molecular layer. BCl$_3$ molecules of the adsorption layer of the BCl$_3$ gas may have a chemical formula in which a bond between boron (B) and chlorine (Cl) is partially broken.

Here, a layer having a thickness of less than one atomic layer means a discontinuously formed atomic layer, and a layer having a thickness of one atomic layer means a continuously formed atomic layer. A layer having a thickness of less than one molecular layer means a discontinuously formed molecular layer, and a layer having a thickness of one molecular layer means a continuously formed molecular layer.

Boron (B) is deposited on the wafers 200 to form a boron (B) layer containing chlorine (Cl) on the wafers 200 under conditions in which BCl$_3$ gas is self-decomposed (pyrolyzed), i.e., conditions causing a pyrolysis reaction of the BCl$_3$ gas. The BCl$_3$ gas is adsorbed onto the wafers 200 to form an adsorption layer of the BCl$_3$ gas on the wafers 200 under conditions in which BCl$_3$ gas is not self-decomposed (pyrolyzed), i.e., conditions that do not cause a pyrolysis reaction of the BCl$_3$ gas. A film-forming rate may be higher when the boron (B) layer containing chlorine (Cl) is formed on the wafers 200 than when the adsorption layer of the BCl$_3$ gas is formed on the wafers 200.

If the thickness of the first layer formed on the wafer 200 exceeds a thickness of several atomic layers, a modification action performed in step 2a which will be described below does not have an effect on the entire first layer. The first layer that may be formed on the wafer 200 may have a minimum thickness of less than one atomic layer. Thus, the first layer may be set to have a thickness of less than one atomic layer to several atomic layers. In addition, the modification action performed in step 2a which will be described below may be relatively increased by controlling the first layer to have a thickness of not more than one atomic layer, i.e., a thickness of less than one atomic layer or of one atomic layer, thereby reducing a time required to perform the modification action in step 2. In addition, a time required to form the first layer in Step 1a may be reduced. Accordingly, a process time per cycle may be reduced and a process time to perform a total of cycles may thus be reduced. That is, a film-forming rate may be increased. In addition, the controllability of film thickness uniformity may be increased by controlling the first layer to have a thickness of one atomic layer or less.

(Removing of Remnant Gas)

After the first layer is formed, the valve 243a is closed to stop the supply of the BCl$_3$ gas. In this case, the inside of the process chamber 201 is vacuum-exhausted by the vacuum pump 246 while the APC valve 244 is open, and the BCl$_3$ gas (that does not react or that has contributed to the formation of the first layer) remaining in the process chamber 201 is eliminated from the inside of the process chamber 201. In this case, N$_2$ gas is continuously supplied as an inert gas into the process chamber 201 while the valves 243e through 243h are open. The N$_2$ gas acts as a purge gas to increase the effect of eliminating the BCl$_3$ gas (that does not react or that has contributed to the formation of the first layer) remaining in the process chamber 201 from the process chamber 201.

In this case, the gas remaining in the process chamber 201 may not be completely eliminated and the inside of the process chamber 201 may not be completely purged. When a small amount of gas remains in the process chamber 201, step 2a to be performed thereafter will not be badly influenced by the gas. In this case, the flow rate of the N$_2$ gas to be supplied into the process chamber 201 need not be high. For example, the inside of the process chamber 201 may be purged without causing step 2a to be badly influenced by the gas by supplying an amount of a gas corresponding to the capacity of the reaction tube 203 (process chamber 201). When the inside of the process chamber 201 is not completely purged, a purge time may be reduced to improve the throughput. Furthermore, the consumption of the N$_2$ gas may be suppressed to a necessary minimum level.

As the chloroborane-based source gas, not only the BCl$_3$ gas but also an inorganic source gas such as monochloroborane (BClH$_2$) gas and dichloroborane (BCl$_2$H) gas or an organic source gas such as dimethyl chloroborane (C$_2$H$_6$BCl) gas, methylethyl chloroborane (CH$_3$C$_2$H$_5$BCl) gas, methyl dichloroborane (CH$_3$BCl$_2$) gas, ethyl dichloroborane (C$_2$H$_5$BCl$_2$) gas, phenyl dichloroborane (C$_6$H$_5$BCl$_2$) gas and cyclohexyl dichloroborane (C$_6$H$_{11}$BCl$_2$) gas may be used. As the inert gas, not only N$_2$ gas but also a rare gas, such as Ar gas, He gas, Ne gas, Xe gas, etc., may be used.

[Step 2a] (Supply of TEA Gas)

After step 1a ends and the gas remaining in the process chamber 201 is eliminated, the valve 243b is opened to supply TEA gas into the second gas supply pipe 232b. The flow rate of the TEA gas is adjusted by the MFC 241b. The TEA gas, the flow rate of which is adjusted, is supplied into the process chamber 201 via the gas supply holes 250b, and exhausted from the exhaust pipe 231. In this case, the TEA gas activated by heat is supplied to the wafers 200. At the same time, the valve 243f is opened to supply N$_2$ gas as an inert gas into the second inert gas supply pipe 232f. The flow rate of the N$_2$ gas is adjusted by the MFC 241f. The N$_2$ gas, the flow rate of which is adjusted, is supplied into the process chamber 201 together with the TEA gas, and exhausted from the exhaust pipe 231.

In this case, in order to prevent the TEA gas from flowing into the nozzles 249a, 249c and 249d and the buffer chamber 237, the valves 243e, 243g and 243h are opened to supply N$_2$ gas into the gas supply pipes 232e, 232g and 232h. The N$_2$ gas is supplied into the process chamber 201 via the gas supply pipes 232a, 232c and 232d, the nozzles 249a, 249c and 249d and the buffer chamber 237, and is then exhausted from the exhaust pipe 231.

In this case, the APC valve 244 is appropriately adjusted to set the inner pressure of the process chamber 201 to range, for example, from 1 to 13,300 Pa, and preferably from 399 to 3,990 Pa. By setting the inner pressure of the process chamber 201 to be relatively high as described above, the TEA gas may be thermally activated without using plasma. A soft reaction may be caused by thermally activating and supplying the TEA gas, thereby causing modification (which will be described below) to be softly performed. The supply flow rate of the TEA gas controlled by the MFC 241b is set to range, for example, from 100 to 2,000 sccm. The supply flow rates of the $N_2$ gas controlled by the MFCs 241e through 241h are set to range, for example, from 100 to 10,000 sccm. In this case, partial pressure of the TEA gas in the process chamber 201 is set to range, for example, from 0.01 to 12,667 Pa. A duration for which the thermally activated TEA gas is supplied to the wafers 200, i.e., a gas supply time (gas irradiation time), is set to range, for example, from 1 to 120 seconds, and preferably from 1 to 60 seconds. In this case, the temperature of the heater 207 is set such that the temperature of the wafers 200 ranges, for example, from 250 to 700° C., and preferably from 300 to 650° C. similar to step 1a.

Under the conditions described above, the first layer formed on the wafers 200 in step 1a may be reacted with the TEA gas by supplying the TEA gas to the wafers 200. That is, a chloro (Cl) group that is an atom of a halogen element contained in the first layer and a ligand (ethyl group) contained in the TEA gas may be reacted with each other. Thus, at least a portion of chlorine (Cl) atoms contained in the first layer may be drawn out (separated) from the first layer, and at least a portion of a plurality of ethyl groups contained in the TEA gas may be separated from the TEA gas. In addition, a nitrogen (N) atom contained in the TEA gas from which the at least a portion of ethyl groups are separated and a boron (B) atom contained in the first layer may be bound to each other. That is, a B—N bond may be formed by binding nitrogen (N) that constitutes the TEA gas and that has a dangling bond since at least the portion of ethyl groups are separated from the TEA gas with a boron (B) atom contained in the first layer and having a dangling bond or a boron (B) atom that had a dangling bond. In addition, in this case, a carbon (C) atom contained in an ethyl group (—$CH_2CH_3$) separated from the TEA gas may be bound with the boron (B) atom contained in the first layer to form a B—C bond. As a result, chlorine (Cl) is separated from the first layer and a nitrogen component is newly introduced into the first layer. In addition, in this case, a carbon (C) component is introduced into the first layer.

Through the series of reactions described above, the chlorine (Cl) is separated from the first layer and the nitrogen (N) component and the carbon (C) component are newly introduced into the first layer to change (modify) the first layer into a second layer containing boron (B), nitrogen (N) and carbon (C), i.e., a boron carbonitride layer (BCN layer). The second layer has a thickness of less than one atomic layer to several atomic layers. The second layer is a layer in which, for example, the rate of the boron (B) component and the rate of the carbon (C) component are relatively high, i.e., a B-rich layer and a C-rich layer.

When a layer containing boron (B), nitrogen (N) and carbon (C) is formed as the second layer, chlorine (Cl) contained in the first layer or hydrogen (H) contained in the TEA gas form a gaseous material, for example, chlorine ($Cl_2$) gas or hydrogen ($H_2$) gas or hydrogen chloride (HCl) gas, during the modification of the first layer using the TEA gas, and is discharged from the inside of the process chamber 201 via the exhaust pipe 231. That is, impurities such as chlorine (Cl) contained in the first layer are drawn out or separated from the first layer to be separated from the first layer. Thus, the second layer is a layer with a lower amount of impurities than the first layer.

(Removing of Remnant Gas)

After the second layer is formed, the valve 243b is closed to stop the supply of the TEA gas. In this case, the inside of the process chamber 201 is vacuum-exhausted by the vacuum pump 246 while the APC valve 244 is open, thereby eliminating the TEA gas (that does not react or that has contributed to the formation of the second layer) or byproducts remaining in the process chamber 201 from the process chamber 201. In this case, $N_2$ gas is continuously supplied as an inert gas into the process chamber 201 while the valves 243e through 243h are open. The $N_2$ gas acts as a purge gas to increase the effect of eliminating the TEA gas (that does not react or that has contributed to formation of the second layer) or by-products remaining in the process chamber 201 from the process chamber 201.

In this case, the gas remaining in the process chamber 201 may not be completely eliminated and the inside of the process chamber 201 may not be completely purged. When a small amount of a gas remains in the process chamber 201, step 1a to be performed thereafter will not be badly influenced by the gas. In this case, the flow rate of the $N_2$ gas to be supplied into the process chamber 201 need not be high. For example, the inside of the process chamber 201 may be purged without causing step 1a to be badly influenced by the gas by supplying an amount of a gas corresponding to the capacity of the reaction tube 203 (process chamber 201). When the inside of the process chamber 201 is not completely purged, a purge time may be reduced to improve the throughput. Furthermore, the consumption of the $N_2$ gas may be suppressed to a necessary minimum level.

Not only triethylamine [$(C_2H_5)_3N$, abbreviated as TEA] but also an ethylamine-based gas obtained by vaporizing diethylamine [$(C_2H_5)_2NH$, abbreviated as DEA], monoethylamine ($C_2H_5NH_2$, abbreviated as MEA), etc., a methylamine-based gas obtained by vaporizing trimethylamine [$(CH_3)_3N$, abbreviated as TMA], dimethylamine [$(CH_3)_2NH$, abbreviated as DMA], monomethylamine ($CH_3NH_2$, abbreviated as MMA), etc., a propylamine-based gas obtained by vaporizing tripropylamine [$(C_3H_7)_3N$, abbreviated as TPA], dipropylamine [$(C_3H_7)_2NH$, abbreviated as DPA], monopropylamine ($C_3H_7NH_2$, abbreviated as MPA), etc., an isopropylamine-based gas obtained by vaporizing triisopropylamine ([$(CH_3)_2CH]_3N$, abbreviated as TIPA), diisopropylamine ([$(CH_3)_2CH]_2NH$, abbreviated as DIPA), monoisopropylamine [$(CH_3)_2CHNH_2$, abbreviated as MIPA], etc., a butylamine-based gas obtained by vaporizing tributylamine [$(C_4H_9)_3N$, abbreviated as TBA], dibutylamine [$(C_4H_9)_2NH$, abbreviated as DBA], monobutylamine ($C_4H_9NH_2$, abbreviated as MBA), etc., or an isobutylamine-based gas obtained by vaporizing triisobutylamine ([$(CH_3)_2CHCH_2]_3N$, abbreviated as TIBA), diisobutylamine ([$(CH_3)_2CHCH_2]_2NH$, abbreviated as DIBA), monoisobutylamine [$(CH_3)_2CHCH_2NH_2$, abbreviated as MIBA], etc. may be preferably used as the amine-based gas. That is, for example, at least one selected from the group consisting of $(C_2H_5)_xNH_{3-x}$, $(CH_3)_xNH_{3-x}$, $(C_3H_7)_xNH_{3-x}$, [$(CH_3)_2CH]_xNH_{3-x}$, $(C_4H_9)_xNH_{3-x}$ and [$(CH_3)_2CHCH_2]_xNH_{3-x}$ may be preferably used as the amine-based gas. Here, 'x' denotes an integer satisfying $1 \leq x \leq 3$.

A gas consisting of the three elements carbon (C), nitrogen (N) and hydrogen (H) and having an empirical formula (one molecule) in which the number of carbon (C) atoms is greater than that of nitrogen (N) atoms may be used as the amine-based gas. That is, a gas containing at least one selected from the group consisting of TEA, DEA, MEA, TMA, DMA, TPA, DPA, MPA, TIPA, DIPA, MIPA, TBA, DBA, MBA, TIBA, DIBA, and MIBA may be used as the amine-based gas.

When a chloroborane-based source gas containing boron (B) and a halogen element (Cl), such as BCl$_3$ gas, is used as a source gas, the concentration of carbon (C) in the second layer formed in step 2a, i.e., the concentration of carbon (C) in a BCN film formed in a process of performing a cycle a predetermined number of times (which will be described below), may be increased by using, as a reactive gas, an amine-based gas consisting of the three elements carbon (C), nitrogen (N) and hydrogen (H) and having an empirical formula (one molecule) in which the number of carbon (C) atoms is greater than the number of nitrogen (N) atoms, such as TEA gas or DEA gas. For example, in the film-forming sequence according to the present embodiment, the concentration of carbon (C) in a formed BCN film may be set to be 25 at % or more, e.g., 40 at % or more.

Thus, if a chloroborane-based source gas containing boron (B) and a halogen element (Cl), such as BCl$_3$ gas, is used as a source gas, the concentration of carbon (C) in the second layer, i.e., the concentration of carbon (C) in a BCN film, when a gas consisting of the three elements carbon (C), nitrogen (N) and hydrogen (H) and having an empirical formula (one molecule) in which the number of carbon (C) atoms is less than the number of nitrogen (N) atoms (e.g., an amine-based gas such as MMA gas or an organic hydrazine-based gas such as MMH gas or DMH gas which will be described below) is used as a reactive gas may be lowered more than when a gas consisting of the three elements carbon (C), nitrogen (N) and hydrogen (H) and having an empirical formula (one molecule) in which the number of carbon (C) atoms is greater than the number of nitrogen (N) atoms, such as an amine-based gas is used as a reactive gas.

Also, a gas containing a plurality of ligands each containing carbon (C) atoms in an empirical formula (in one molecule), i.e., a gas containing a plurality of hydrocarbon groups (such as alkyl groups) in an empirical formula (in one molecule), may be used as the amine-based gas. Specifically, a gas containing two or three ligands containing carbon (C) atoms in an empirical formula (in one molecule) (hydrocarbon groups such as alkyl groups) may be used as the amine-based gas. For example, a gas containing one selected from the group consisting of TEA, DEA, TMA, DMA, TPA, DPA, TIPA, DIPA, TBA, DBA, TIBA and DIBA may be used.

When a chloroborane-based source gas containing boron (B) and a halogen element (Cl), such as BCl$_3$ gas, is used as a source gas, the concentration of carbon (C) in the second layer, i.e., the concentration of carbon (C) in the BCN film, may be greatly increased by using, as a reactive gas, an amine-based gas consisting of the three elements carbon (C), nitrogen (N) and hydrogen (H) and containing a plurality of ligands each containing carbon (C) in an empirical formula (in one molecule), such as TEA gas or DEA gas, i.e., an amine-based gas containing a plurality of hydrocarbon groups such as alkyl groups in an empirical formula (in one molecule).

Thus, if a chloroborane-based source gas containing boron (B) and a halogen element (Cl), such as BCl$_3$ gas, is used as a source gas, the concentration of carbon (C) in the second layer, i.e., the concentration of carbon (C) in the BCN film, when an amine-based gas (such as MMA gas) or an organic hydrazine-based gas (such as MMH gas which will be described below) that does not contain a plurality of ligands containing carbon (C) atoms in an empirical formula (in one molecule) is used as a reactive gas may be lowered more than when an amine-based gas containing a plurality of ligands containing carbon (C) atoms in an empirical formula (in one molecule) is used as a reactive gas.

Also, a cycle rate (the thickness of a BCN layer formed per unit cycle) and the ratio of the concentration of nitrogen (N) in the second layer to the concentration of carbon (C) therein (i.e., N concentration/C concentration), i.e., the ratio of the concentration of nitrogen (N) in the BCN film to the concentration of carbon (C) therein, (i.e., N concentration/C concentration) when an amine-based gas containing two ligands containing carbon (C) atoms in an empirical formula (in one molecule), such as DEA gas, is used as a reactive gas may be increased more than when an amine-based gas containing three ligands containing carbon (C) atoms in an empirical formula (in one molecule) such as TEA gas is used as a reactive gas.

In contrast, the ratio of the concentration of carbon (C) in the second layer to the concentration of nitrogen (N) therein (i.e., C concentration/N concentration), i.e., the ratio of the concentration of carbon (C) in the BCN film to the concentration of nitrogen (N) therein, (i.e., C concentration/N concentration) when an amine-based gas containing three ligands containing carbon (C) atoms in an empirical formula (in one molecule), such as TEA gas, is used as a reactive gas may be increased more than when an amine-based gas containing two ligands containing carbon (C) atoms in an empirical formula (in one molecule) such as EEA gas is used as a reactive gas.

That is, the cycle rate or the concentration of nitrogen (N) or carbon (C) in a BCN film to be formed may be finely adjusted according to the number of ligands containing carbon (C) (i.e., the number of hydrocarbon groups such as alkyl groups) contained in the reactive gas, i.e., by appropriately changing the type of a reactive gas.

The concentration of carbon (C) atoms in the BCN film may be increased by appropriately selecting a gas type (composition) of an amine-based gas as a reactive gas as described above. In addition, in order to greatly increase the concentration of carbon (C) in the BCN film, the inner pressure of the process chamber 201, for example, when an amine-based gas (TEA gas) is supplied to the wafer 200 is preferably set to be higher than the inner pressure of the process chamber 201 when a chloroborane-based source gas (BCl$_3$ gas) is supplied to the wafer 200 in step 1a. That is, if the inner pressure of the process chamber 201 when the BCl$_3$ gas is supplied to the wafer 200 is P$_1$ [Pa] and is P$_2$ [Pa] when the TEA gas is supplied to the wafer 200, then the pressures P$_1$ and P$_2$ are preferably set to satisfy a relation of P$_2$>P$_1$.

In contrast, in order to appropriately suppress an increase in the concentration of carbon (C) in the BCN film, the inner pressure of the process chamber 201 when the amine-based gas (TEA gas) is supplied to the wafer 200 is preferably set to be less than or equal to the inner pressure of the process chamber 201 when a chloroborane-based source gas (BCl$_3$ gas) is supplied to the wafer 200 in step 1a. That is, the pressures P$_1$ and P$_2$ are preferably set to satisfy a relation of P$_1$≥P$_2$.

That is, the concentration of carbon (C) in the BCN film to be formed may be finely adjusted by appropriately controlling the inner pressure of the process chamber 201 when the amine-based gas is supplied to the wafer 200.

In addition to N$_2$ gas, a rare gas such as Ar gas, He gas, Ne gas, or Xe gas may be used as an inert gas.

(Performing a Cycle a Predetermined Number of Times)

A BCN film having a predetermined composition may be formed on the wafer 200 to a predetermined thickness by performing a cycle including steps 1a and 2a described above at least once (a predetermined number of times), i.e., by alternately performing steps 1a and 2a at least once (a predetermined number of times). The cycle described above is preferably performed a plurality of times. That is, a thickness of a BCN layer to be formed per cycle may be set to be less than a desired thickness and the cycle may be performed a plurality of times until the BCN film has the desired thickness.

When a cycle is performed a plurality of times, 'a specific gas being supplied to the wafer 200' in each step after the cycle is performed at least twice means that the specific gas is supplied on a layer formed on the wafer 200, i.e., on the uppermost surface of the wafer 200 as a stacked structure. 'A specific layer being formed on the wafer 200' means that the specific layer is formed on a layer formed on the wafer 200, i.e., on the uppermost surface of the wafer 200 as a stacked structure. This has been described above, and also applies to modified examples and other embodiments which will be described below.

(Purging and Atmospheric Pressure Recovery)

After the BCN film having the predetermined composition is formed to the predetermined thickness, the valves 243e through 243h are opened to supply $N_2$ gas as an inert gas into the process chamber 201 via the gas supply pipes 232e through 232h and then the $N_2$ gas is exhausted from the exhaust pipe 231. The $N_2$ gas acts as a purge gas to purge the inside of the process chamber 201 with the inert gas, thereby eliminating a gas or by-products remaining in the process chamber 201 from the process chamber 201 (purging). Thereafter, an atmosphere in the process chamber 201 is replaced with the inert gas (inert gas replacement), and the inner pressure of the process chamber 201 is thus recovered to normal pressure (atmospheric pressure recovery).

(Boat Unloading and Wafer Discharging)

Then, the seal cap 219 is moved downward by the boat elevator 115 to open the lower end of the reaction tube 203, and the processed wafers 200 are unloaded to the outside of the reaction tube 203 from the lower end of the reaction tube 203 while being supported by the boat 217 (boat unloading). Thereafter, the processed wafers 200 are unloaded from the boat 217 (wafer discharging).

(3) Effect of the Present Embodiment

According to the present embodiment, one or more effects which will be described below may be obtained.

(a) According to the present embodiment, a BCN film may be formed on the wafer 200 by alternately performing a predetermined number of times a process of supplying $BCl_3$ gas to the wafer 200 and the process of supplying TEA gas to the wafer 200. Thus, productivity may increase when the BCN film is formed. That is, in a film-forming sequence according to the related art, three types of gases including a gas containing at least boron (B), a gas containing at least carbon (C) and a gas containing at least nitrogen (N) should be alternately supplied to the wafer 200 to form a BCN film. In contrast, in a film-forming sequence according to the present embodiment, a BCN film may be formed by alternately supplying two types of gases including $BCl_3$ gas and TEA gas to the wafer 200. Thus, since it is possible to simplify control of the supply of a gas, the number of processes of supplying a gas per cycle may decrease, thereby improving the productivity when a film is formed. In addition, since the number of the types of gases to be used to form a film decreases, the structure of a gas supply system may be simplified to reduce the number of nozzles. Accordingly, the cost of a device may decrease to enable the device to be easily maintained.

(b) According to the present embodiment, the process of supplying $BCl_3$ gas to the wafer 200 and the process of supplying TEA gas to the wafer 200 may be alternately performed a predetermined number of times to form a BCN film that is a B-rich film and a C-rich film on the wafer 200. That is, in the film-forming sequence according to the present embodiment, boron (B) and carbon (C) may be sufficiently fixedly formed on the wafer 200 during the formation of the BCN film and can be sufficiently suppressed from being separated from the wafer 200, thereby forming a BCN film having a high concentration of carbon (C), compared to the film-forming sequence according to the related art of alternately supplying to the wafer 200 three types of gases including a gas containing at least boron (B), a gas containing at least carbon (C) and a gas containing at least nitrogen (N).

(c) According to the present embodiment, the concentration of carbon (C) in the BCN film may be increased according to the ratio of the number of carbon (C) atoms in a reactive gas to the number of nitrogen (N) atoms therein, i.e., by appropriately selecting the type of a reactive gas. For example, the concentration of carbon (C) in the BCN film may be increased by using, as a reactive gas, an amine-based gas consisting of the three elements carbon (C), nitrogen (N) and hydrogen (H) and having an empirical formula (one molecule) in which the number of carbon (C) atoms is greater than the number of nitrogen (N) atoms.

In particular, the concentration of carbon (C) in the BCN film may be increased by using, as a reactive gas, an amine-based gas containing a plurality of ligands containing carbon (C) atoms in an empirical formula (in one molecule), i.e., an amine-based gas containing a plurality of hydrocarbon groups such as alkyl groups in an empirical formula (in one molecule). Specifically, the concentration of carbon (C) in the BCN film may be increased by using, as a reactive gas, TEA gas, TMA gas, TPA gas, TIPA gas, TBA gas, or TIBA gas containing three ligands containing carbon (C) atoms (hydrocarbon groups such as alkyl groups) in an empirical formula (in one molecule), DEA gas, DMA gas, DPA gas, DIPA gas, DBA gas, or DIBA gas containing two ligands containing carbon (C) (hydrocarbon groups such as alkyl groups) in an empirical formula (in one molecule), or the like.

(d) According to the present embodiment, a cycle rate (the thickness of a BCN layer formed per unit cycle) or the concentration of nitrogen (N) or carbon (C) in the BCN film may be finely adjusted by appropriately changing the type of a reactive gas according to the number of ligands containing carbon (C) atoms (the number of hydrocarbon groups such as alkyl groups) in the reactive gas.

For example, the cycle rate and the ratio of the concentration of nitrogen (N) to the concentration of carbon (C) in the BCN film (i.e., N concentration/C concentration) may be increased more when an amine-based gas containing two ligands containing carbon (C) atoms in an empirical formula (in one molecule), such as DEA gas, is used as a reactive gas than when an amine-based gas containing three ligands containing carbon (C) atoms in an empirical formula (in one molecule), such as TEA gas, is used as a reactive gas.

Also, for example, the ratio of the concentration of carbon (C) to the concentration of nitrogen (N) in the BCN film (i.e., C concentration/N concentration) may be increased more when an amine-based gas containing three ligands containing carbon (C) atoms in an empirical formula (in one molecule), such as TEA gas, is used as a reactive gas than when an amine-based gas containing two ligands containing carbon (C) atoms in an empirical formula (in one molecule), such as DEA gas, is used as a reactive gas.

(e) According to the present embodiment, the concentration of carbon (C) in the BCN film may be finely adjusted by controlling the inner pressure of the process chamber 201 when the reactive gas is supplied.

For example, the concentration of carbon (C) in the BCN film may be greatly increased by setting the inner pressure of the process chamber 201 when TEA gas is supplied to the wafer 200 in step 2a to be higher than the inner pressure of the process chamber 201 when $BCl_3$ gas is supplied to the wafer 200 in step 1a.

Also, an increase in the concentration of carbon (C) in the BCN film may be appropriately suppressed by setting the inner pressure of the process chamber 201 when TEA gas is supplied to the wafer 200 in step 2a to be less than or equal to the inner pressure of the process chamber 201 when $BCl_3$ gas is supplied to the wafer 200 in step 1a.

Also, the tolerance of the BCN film to hydrofluoric acid (HF) or hot phosphoric acid may be controlled by adjusting the concentration of carbon (C) or nitrogen (N) in the BCN film. For example, the tolerance of the BCN film to hydrofluoric acid (HF) may be set to be higher than the tolerance of a BN film to hydrofluoric acid (HF) by increasing the concentration of boron (B) or carbon (C) in the BCN film, and may be set to be less than or substantially the same as the tolerance of the BN film to hydrofluoric acid (HF) by decreasing the concentration of boron (B) or carbon (C) in the BCN film. In addition, for example, the tolerance of the BCN film to hot phosphoric acid may be set to be lower than the tolerance of the BN film to hot phosphoric acid by increasing the concentration of nitrogen (N) in the BCN film, and may be set to be higher than or substantially the same as the tolerance of the BN film to hot phosphoric acid by decreasing the concentration of nitrogen (N) in the BCN film. In addition, for example, the tolerance of the BCN film to hot phosphoric acid may be set to be higher than the tolerance of the BN film to hot phosphoric acid by increasing the concentration of carbon (C) in the BCN film.

(f) According to the present embodiment, the concentration of impurities in a BCN film to be formed may be lowered by using, as a reactive gas, an amine-based gas that consists of the three elements carbon (C), nitrogen (N) and hydrogen (H) and that does not contain boron (B) or a metal. That is, in the film-forming sequence using TEA gas as a reactive gas according to the present embodiment, a probability that impurity elements will be mixed into the second layer obtained by reacting the first layer with the reactive gas may be reduced to reduce the concentration of impurities in a BCN film to be formed, compared to a film-forming sequence of using, as a reactive gas, tetrakis(ethylmethyl) aminohafnium $(Hf[N(C_2H_5)(CH_3)]_4$, abbreviated as TEMAH) gas consisting of the four elements hafnium (Hf), carbon (C), nitrogen (N) and hydrogen (H).

(g) According to the present embodiment, the controllability of reactions (and particularly, the controllability of compositions) may be improved when a BCN film is formed by using, as a reactive gas, an amine-based gas that consists of the three elements carbon (C), nitrogen (N) and hydrogen (H) and that does not contain boron (B) or a metal, such as TEA gas, and by employing a film-forming sequence of alternately supplying $BCl_3$ gas and TEA gas to the wafer 200. That is, in the film-forming sequence using TEA gas as a reactive gas according to the present embodiment, the controllability of a reaction (and particularly, the controllability of composition) when the second layer is formed by reacting the first layer with the reactive gas may be improved, compared to a film-forming sequence using, as a reactive gas, for example, TEMAH gas consisting of the four elements hafnium (Hf), carbon (C), nitrogen (N) and hydrogen (H). In addition, in the film-forming sequence according to the present embodiment in which two types of gases containing $BCl_3$ gas and TEA gas are alternately supplied to the wafer 200, the controllability of reactions (and particularly, the controllability of compositions) may be improved when a BCN film is formed, compared to a film-forming sequence of alternately supplying three types of gases including a gas containing boron (B), a gas containing carbon (C) and a gas containing nitrogen (N) on the wafer 200. Thus, it is possible to easily control the composition of the BCN film. As a result, the etching resistance or permittivity of the BCN film to be formed may be improved.

(h) According to the present embodiment, an amine-based gas that consists of the three elements carbon (C), nitrogen (N) and hydrogen (H) and that does not contain boron (B) or a metal, such as TEA gas, may be used as a reactive gas to improve the film thickness uniformity of the BCN film in the planes of the wafers 200 and between the planes of the wafers 200. That is, the TEA gas consisting of the three elements carbon (C), nitrogen (N) and hydrogen (H) has high reactivity to the first layer, compared to, for example, TEMAH gas consisting of the four elements hafnium (Hf), carbon (C), nitrogen (N) and hydrogen (H). Thus, in the film-forming sequence using TEA gas as a reactive gas according to the present embodiment, the reaction between the reactive gas and the first layer may be securely and uniformly performed in the planes of the wafers 200 and between the planes of the wafers 200. Accordingly, the film thickness uniformity of the BCN film may be improved in the planes of the wafers 200 and between the planes of the wafers 200.

Modified Example

Figure 5B:
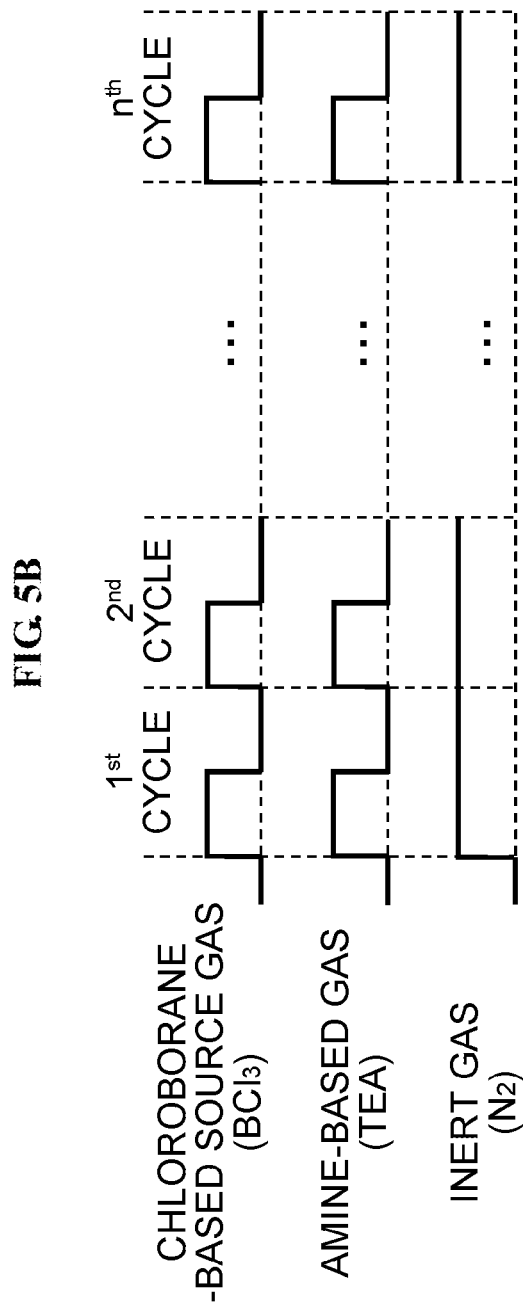

In the above-described film-forming sequences illustrated in FIGS. 4 and 5A, cases in which a cycle in which steps 1a and 2a are alternately performed is performed at least once (a predetermined number of times) have been described. However, embodiments of the present invention are not limited thereto. For example, a cycle of simultaneously performing steps 1a and 2a may be performed at least once (a predetermined number of times). FIG. 5B illustrates a case in which a cycle of simultaneously performing steps 1a and 2a is performed a plurality of times (n times), and FIG. 5C illustrates a case in which a cycle of simultaneously performing steps 1a and 2a is performed once. The thickness of a BCN film may be controlled by mainly adjusting the number of times that a cycle is performed in the film-forming sequence of FIG. 5B and mainly adjusting a time that a cycle is performed (a gas supply time) in the film-forming sequence of FIG. 5C. In this case, process conditions may be set to be the same as those in the film-forming sequences of FIGS. 4 and 5A.

When $BCl_3$ gas and TEA gas are simultaneously supplied, the effects according to the previous embodiment may also be achieved. However, in this case, the supply of the $BCl_3$ gas and the supply of the TEA gas are preferably alternately performed while the inside of the process chamber 201 is purged between the supply of the $BCl_3$ gas and the supply of the TEA gas as in the previous embodiment, so that the $BCl_3$ gas and the TEA gas may be appropriately reacted under conditions that cause a surface reaction to be dominant and the controllability of film thickness may be increased.

Second Embodiment of the Present Invention

Next, a second embodiment of the present invention will be described below.

In the above-described first embodiment, a case in which the cycle including steps 1a and 2a is performed a predetermined number of times to form a BCN film on a substrate has been described. In the present embodiment, a case in which a BCN film or a BN is formed on a substrate by performing a predetermined number of times a cycle including not only steps 1b and 2b (which are similar to steps 1a and 2a described above) but also step 3b of supplying a nitriding gas to the substrate will be described.

(First Sequence)

Figure 6:
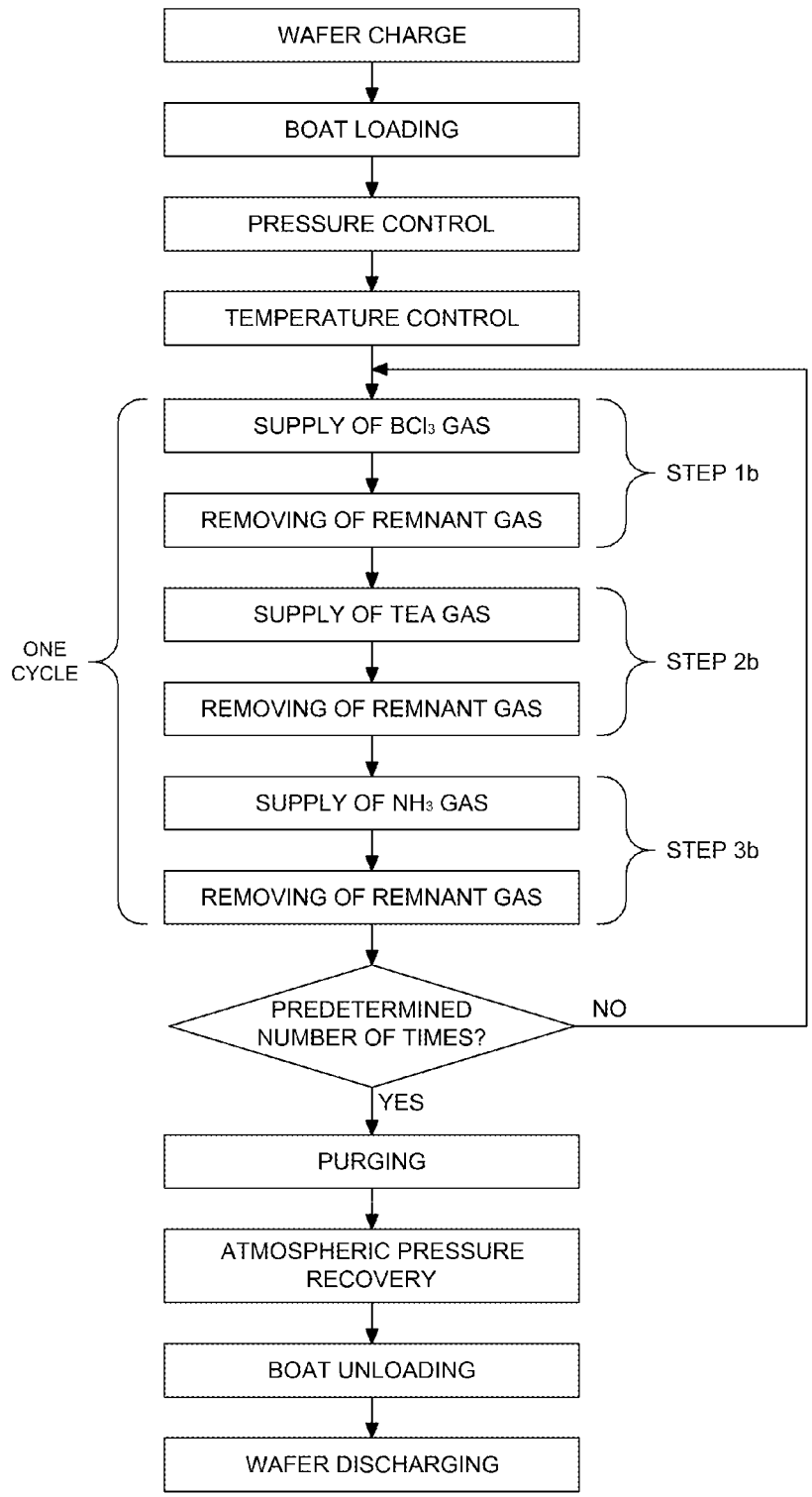
FIG. 6 illustrates a film-forming flow in a first sequence according to a second embodiment of the present invention.

First, a first sequence according to the present embodiment will be described with reference to FIGS. 6 and 7.

In the first sequence according to the present embodiment, a cycle including a process of supplying a chloroborane-based source gas (e.g., $BCl_3$ gas) as a source gas containing boron (B) and a halogen element (Cl) to the wafer 200, a process of supplying, as a reactive gas, an amine-based gas (TEA gas) consisting of the three elements carbon (C), nitrogen (N) and hydrogen (H) to the wafer 200, and a process of supplying a nitriding gas (e.g., $NH_3$ gas) to the wafer 200 is performed a predetermined number of times to form a BCN film or a BN film on the wafer 200.

The first sequence according to the second embodiment is substantially the same as the film-forming sequence according to the first embodiment, except that step 3b is further included in addition to steps 1b and 2b similar to steps 1a and 2a. Step 3b according to the present embodiment will be described below.

[Step 3b] (Supply of $NH_3$ Gas)

After step 2b is completed and a gas remaining in the process chamber 201 is removed, the valve 243c is opened to supply $NH_3$ gas into the gas supply pipe 232c. The flow rate of the $NH_3$ gas is adjusted by the MFC 241c and the $NH_3$ gas, the flow rate of which is adjusted, is supplied into the buffer chamber 237 via the gas supply holes 250c. In this case, high frequency power is not supplied between the rod-shaped electrodes 269 and 270. Thus, the $NH_3$ gas supplied into the buffer chamber 237 is thermally activated, supplied into the process chamber 201 via the gas supply holes 250e, and exhausted from the exhaust pipe 231 [see FIG. 7A]. In addition, in this case, the $NH_3$ gas supplied into the buffer chamber 237 is plasma-excited by supplying high frequency power between the rod-shaped electrodes 269 and 270 from the high frequency power source 273, supplied as an active species into the process chamber 201 via the gas supply holes 250e, and exhausted from the exhaust pipe 231 [see FIG. 7B]. In this case, the $NH_3$ gas activated by heat or plasma is supplied to the wafer 200. At the same time, the valve 243g is opened to supply $N_2$ gas into the gas supply pipe 232g. The $N_2$ gas is supplied into the process chamber 201 together with the $NH_3$ gas, and exhausted from the exhaust pipe 231.

In this case, in order to prevent the $NH_3$ gas from flowing into the nozzles 249a, 249b and 249d, the valves 243e, 243f and 243h are opened to supply $N_2$ gas into the gas supply pipes 232e, 232f and 232h. The $N_2$ gas is supplied into the process chamber 201 via the gas supply pipes 232a, 232b and 232d and the nozzles 249a, 249b and 249d, and exhausted from the exhaust pipe 231.

When the $NH_3$ gas is activated by heat and supplied without being plasma-excited, the APC valve 244 is appropriately controlled to set the inner pressure of the process chamber 201 to range, for example, from 1 to 3,000 Pa. By setting the inner pressure of the process chamber 201 to be relatively high as described above, the $NH_3$ gas may be thermally activated without using plasma. When the $NH_3$ gas is activated by heat and supplied, a relatively soft reaction may be caused. Thus, nitriding which will be described below may be relatively softly performed. The partial pressure of the $NH_3$ gas in the process chamber 201 is set to range, for example, from 0.01 to 2,970 Pa. The supply flow rate of the $NH_3$ gas controlled by the MFC 241c is set to range, for example, from 100 to 10,000 sccm. The supply flow rates of the $N_2$ gas controlled by the respective MFCs 241e through 241h are set to range, for example, from 100 to 10,000 sccm. A duration for which the thermally activated $NH_3$ gas is supplied to the wafers 200, i.e., a gas supply time (gas irradiation time), is set to range, for example, from 1 to 120 seconds, and preferably from 1 to 60 seconds. In this case, the temperature of the heater 207 is set such that the temperature of the wafers 200 ranges, for example, from 250 to 700° C., and preferably from 300 to 650° C., similar to steps 1b and 2b.

When the $NH_3$ gas is plasma-excited to be supplied as an active species, the APC valve 244 is appropriately controlled to set the inner pressure of the process chamber 201 to range, for example, from 1 to 100 Pa. The partial pressure of the $NH_3$ gas in the process chamber 201 is set to range, for example, from 0.01 to 100 Pa. The supply flow rate of the $NH_3$ gas controlled by the MFC 241c is set to range, for example, from 100 to 10,000 sccm. The supply flow rates of the $N_2$ gas controlled by the respective MFCs 241e through 241h are set to range, for example, from 100 to 10,000 sccm. A duration for which the active species obtained by plasma-exciting the $NH_3$ gas is supplied to the wafers 200, i.e., a gas supply time (gas irradiation time), is set to range, for example, from 1 to 120 seconds, and preferably from 1 to 60 seconds. In this case, the temperature of the heater 207 is set such that the temperature of the wafers 200 ranges, for example, from 250° C. to 700° C., preferably from 300° C. to 650° C., and more preferably from 350° C. to 600° C., similar to steps 1b and 2b. High frequency power supplied between the rod-shaped electrodes 269 and 270 from the high frequency power source 273 is set to range, for example, from 50 W to 1,000 W.

In this case, a gas supplied into the process chamber 201 is an active species obtained either by thermally activating the $NH_3$ gas by increasing the inner pressure of the process chamber 201 or by plasma-activating the $NH_3$ gas. Neither $BCl_3$ gas nor TEA gas is supplied into the process chamber 201. Thus, the $NH_3$ gas does not cause a gas phase reaction, and the activated $NH_3$ gas or the active species obtained from the $NH_3$ gas reacts with at least a portion of a second layer formed on the wafer 200 in step 2b. Thus, the second layer is nitrided to be modified into a third layer (BCN layer) containing boron (B), carbon (C) and nitrogen (N) or a third layer (BN layer) containing boron (B) and nitrogen (N). The third layer has a thickness of, for example, less than one atomic layer to several atomic layers.

During a process of forming the third layer, the second layer is modified by nitriding the second layer using a nitriding gas. That is, nitrogen (N) is further supplied to the second layer by nitriding the second layer. In addition, when the second layer is nitrided, at least a portion of carbon (C) atoms contained in the second layer are separated (drawn out) from the second layer. That is, the concentration of nitrogen (N) in the third layer is higher than that of nitrogen (N) in the second layer, and the concentration of carbon (C) in the third layer is lower than that of carbon (C) in the second layer.

As illustrated in FIG. 7A, the second layer is thermally nitrided to be modified (changed) into the third layer by activating the NH$_3$ gas by heat and supplying the thermally activated NH$_3$ gas into the process chamber 201. In this case, the second layer is modified into the third layer by increasing the rate of a nitrogen (N) component in the second layer and separating (drawing out) at least a portion of a carbon (C) component in the second layer from the second layer using the energy of the activated NH$_3$. In this case, by performing thermal nitridation using the NH$_3$ gas, B—N bonds increase in the second layer but B—C bonds and B—B bonds decrease in the second layer and the rates of carbon (C) and boron (B) components decrease in the second layer. In particular, most of the carbon (C) component may be separated from the second layer to reduce the amount of the carbon (C) component to be equal to the amount of impurities. That is, the second layer may be modified into the third layer such that the concentration of nitrogen (N) increases and the concentrations of carbon (C) and boron (B) decrease. In this case, the rate of nitrogen (N), i.e., the concentration of nitrogen (N), in the third layer may be finely adjusted by controlling conditions such as the inner pressure of the process chamber 201, a gas supply time, etc., thereby more finely controlling the composition of the third layer.

Figure 7B:
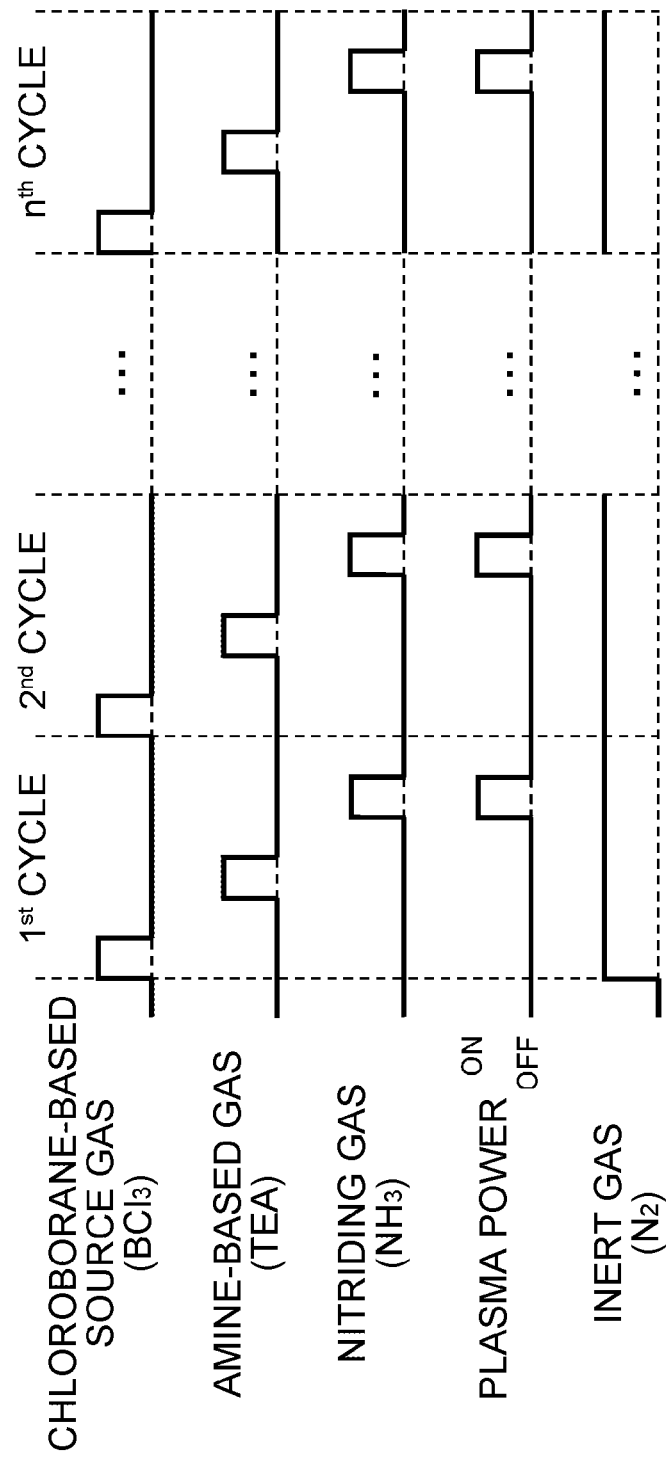

Also, as illustrated in FIG. 7B, an active species obtained by plasma-exciting NH$_3$ gas may be supplied into the process chamber 201 to plasma-nitride the second layer to be modified (changed) into the third layer. In this case, the second layer is modified (changed) into the third layer by increasing the rate of a nitrogen (N) component in the second layer and separating (drawing out) at least a portion of a carbon (C) component from the second layer using the energy of the active species. In this case, by performing plasma nitridation using the NH$_3$ gas, B—N bonds increase in the second layer but B—C bonds and B—B bonds decrease in the second layer and the rates of carbon (C) and boron (B) components decrease in the second layer. In particular, most of the carbon (C) component may be separated from the second layer to reduce the amount of the carbon (C) component to be equal to the amount of impurities or to substantially extinguish the carbon (C) component. That is, the second layer may be modified into the third layer such that the concentration of nitrogen (N) increases and the concentrations of carbon (C) and boron (B) decrease. In this case, the rate of nitrogen (N), i.e., the concentration of nitrogen (N), in the third layer may be finely adjusted by controlling conditions such as the inner pressure of the process chamber 201, a gas supply time, etc., thereby more finely controlling the composition of the third layer.

In this case, the nitridation of the second layer is preferably not saturated. For example, in steps 1b and 2b, when the second layer is formed to a thickness of less than one atomic layer to several atomic layers, a part of the second layer is preferably nitrided. In this case, nitridation is performed under conditions that cause the nitridation of the second layer to be unsaturated, so that the second layer having the thickness of less than one atomic layer to several atomic layers may not be completely nitrided.

In order to unsaturate the nitridation of the second layer, process conditions in step 3b are preferably set as described above. In addition, the nitridation of the second layer may be easily unsaturated when the process conditions in step 3b are set as follows:

[When NH$_3$ Gas is Activated by Heat and Supplied]
Temperature of wafer: 500° C. to 650° C.
Pressure in process chamber: 133 Pa to 2,666 Pa
Partial pressure of NH$_3$ gas: 33 Pa to 2,515 Pa
Supply flow rate of NH$_3$ gas: 1,000 sccm to 5,000 sccm
Supply flow rate of N$_2$ gas: 300 sccm to 3,000 sccm
Supply duration of NH$_3$ gas: 6 to 60 seconds
[When NH$_3$ Gas is Activated by Plasma and Supplied]
Temperature of wafer: 500° C. to 650° C.
Pressure in process chamber: 33 Pa to 80 Pa
Partial pressure of NH$_3$ gas: 17 Pa to 75 Pa
Supply flow rate of NH$_3$ gas: 1,000 sccm to 5,000 sccm
Supply flow rate of N$_2$ gas: 300 sccm to 1,000 sccm
Supply duration of NH$_3$ gas: 6 to 60 seconds
(Removing of Remnant Gas)

After the third layer is formed, the valve 243c is closed to stop the supply of the NH$_3$ gas. In this case, the inside of the process chamber 201 is vacuum-exhausted by the vacuum pump 246 while the APC valve 244 is open, thereby eliminating the NH$_3$ gas (that does not react or that has contributed to the formation of the third layer) or byproducts remaining in the process chamber 201 from the process chamber 201. In this case, N$_2$ gas is continuously supplied into the process chamber 201 while the valves 243e through 243h are open. The N$_2$ gas acts as a purge gas to increase the effect of eliminating the NH$_3$ gas (that does not react or that has contributed to formation of the third layer) or by-products remaining in the process chamber 201 from the process chamber 201.

In this case, the gas remaining in the process chamber 201 may not be completely eliminated and the inside of the process chamber 201 may not be completely purged. When a small amount of gas remains in the process chamber 201, step 1b to be performed thereafter will not be badly influenced by the gas. In this case, the flow rate of the N$_2$ gas to be supplied into the process chamber 201 need not be high. For example, the inside of the process chamber 201 may be purged without causing step 1b to be badly influenced by the gas by supplying an amount of a gas corresponding to the capacity of the reaction tube 203 (process chamber 201). When the inside of the process chamber 201 is not completely purged, a purge time may be reduced to improve the throughput. Furthermore, the consumption of the N$_2$ gas may be suppressed to a necessary minimum level.

Not only NH$_3$ gas but also diazene (N$_2$H$_2$) gas, hydrazine (N$_2$H$_4$) gas, N$_3$H$_8$ gas, or a compound thereof may be used as the nitriding gas (nitrogen-containing gas). In addition to N$_2$ gas, a rare gas such as Ar gas, He gas, Ne gas, or Xe gas maybe used as the inert gas.

(Performing a Cycle a Predetermined Number of Times)

A BCN film or a BN film having a predetermined composition may be formed on the wafer 200 to a predetermined thickness by performing a cycle including steps 1b to 3b described above at least once (a predetermined number of times). The cycle described above is preferably performed a plurality of times. That is, a thickness of a BCN layer or a BN layer to be formed per cycle may be set to be less than a desired thickness and the cycle may be performed a plurality of times until the BCN film or the BN film has the desired thickness.

(Second Sequence)

Figure 8:
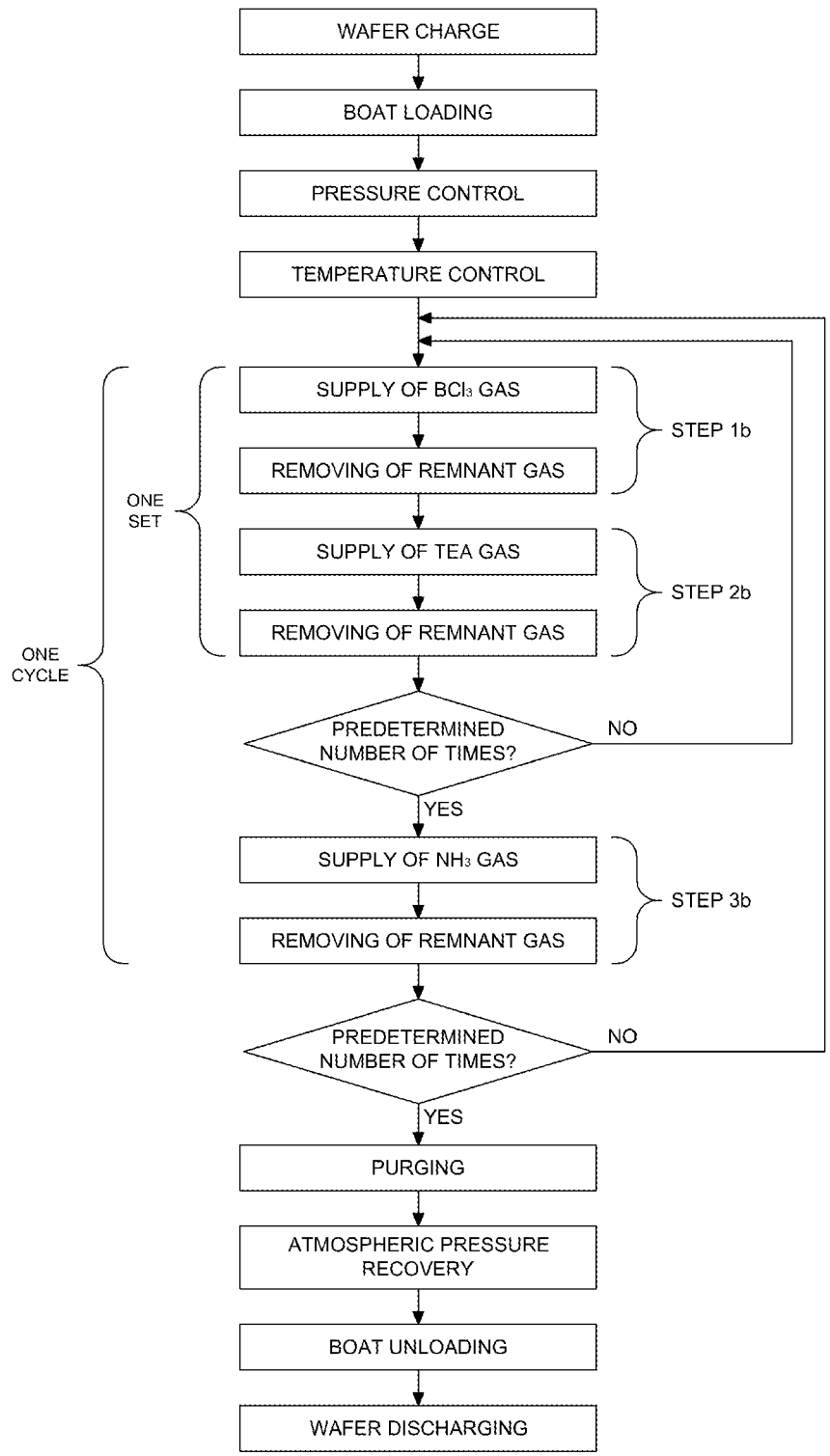
FIG. 8 illustrates a film-forming flow in a second sequence according to the second embodiment of the present invention.

Next, a second sequence according to the present embodiment will be described with reference to FIGS. 8 and 9.

In the second sequence according to the present embodiment, a cycle including a process of alternately performing a predetermined number of times a process of supplying a chloroborane-based source gas ($BCl_3$ gas) as a source gas containing boron (B) and a halogen element (Cl) to the wafer 200 and a process of supplying, as a reactive gas, an amine-based gas (TEA gas) consisting of the three elements carbon (C), nitrogen (N) and hydrogen (H) to the wafer 200, and a process of supplying a nitriding gas ($NH_3$ gas) to the wafer 200 is performed a predetermined number of times to form a BCN film or a BN film on the wafer 200.

Figure 9A:
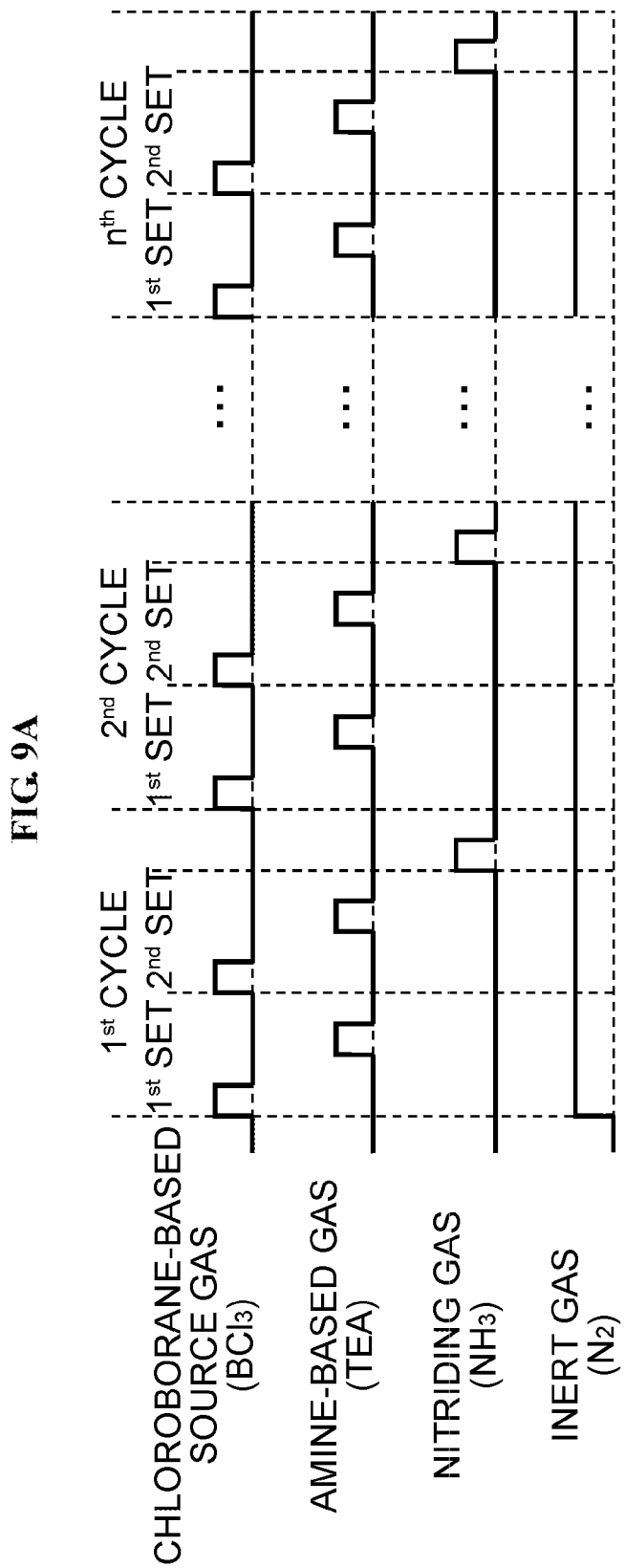
Figure 9B:
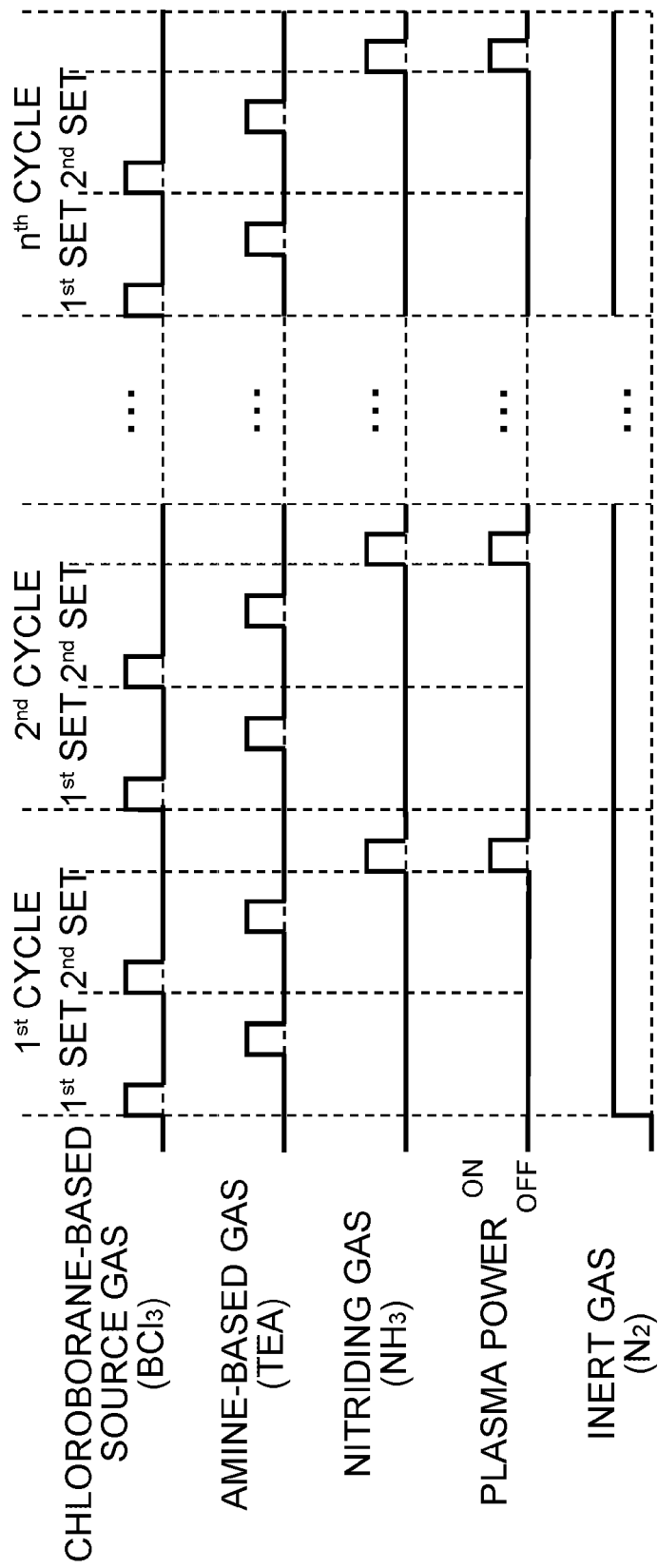

FIG. 9 illustrates a case in which a cycle of performing a set of steps 1b and 2b described above twice and performing step 3b is performed n times to form a BCN film or a BN film having a predetermined composition to a predetermined thickness on the wafer 200. The second sequence is substantially the same as the first sequence except that a set of steps 1b and 2b described above is repeatedly performed a plurality of times and then step 3b is performed. In addition, process conditions in the second sequence may be set to be the same as those in the first sequence.

Effects of the Present Embodiment

A film-forming sequence according to the present embodiment has effects similar to those of the first embodiment. In addition, in the film-forming sequence according to the present embodiment, the composition of the BCN film or the BN film may be finely adjusted as described above by performing step 3b of supplying $NH_3$ gas to the wafer 200.

Third Embodiment of the Present Invention

Next, a third embodiment of the present invention will be described below.

In the above-described first embodiment, the case in which the cycle including steps 1a and 2a is performed a predetermined number of times to form a BCN film on a substrate has been described. In the present embodiment, a case in which a BCN film is formed on a substrate by performing step 2c of supplying a carbon-containing gas to the substrate a predetermined number of times between steps 1c and 3c (which are similar to steps 1a and 2a described above) will be described.

Figure 10:
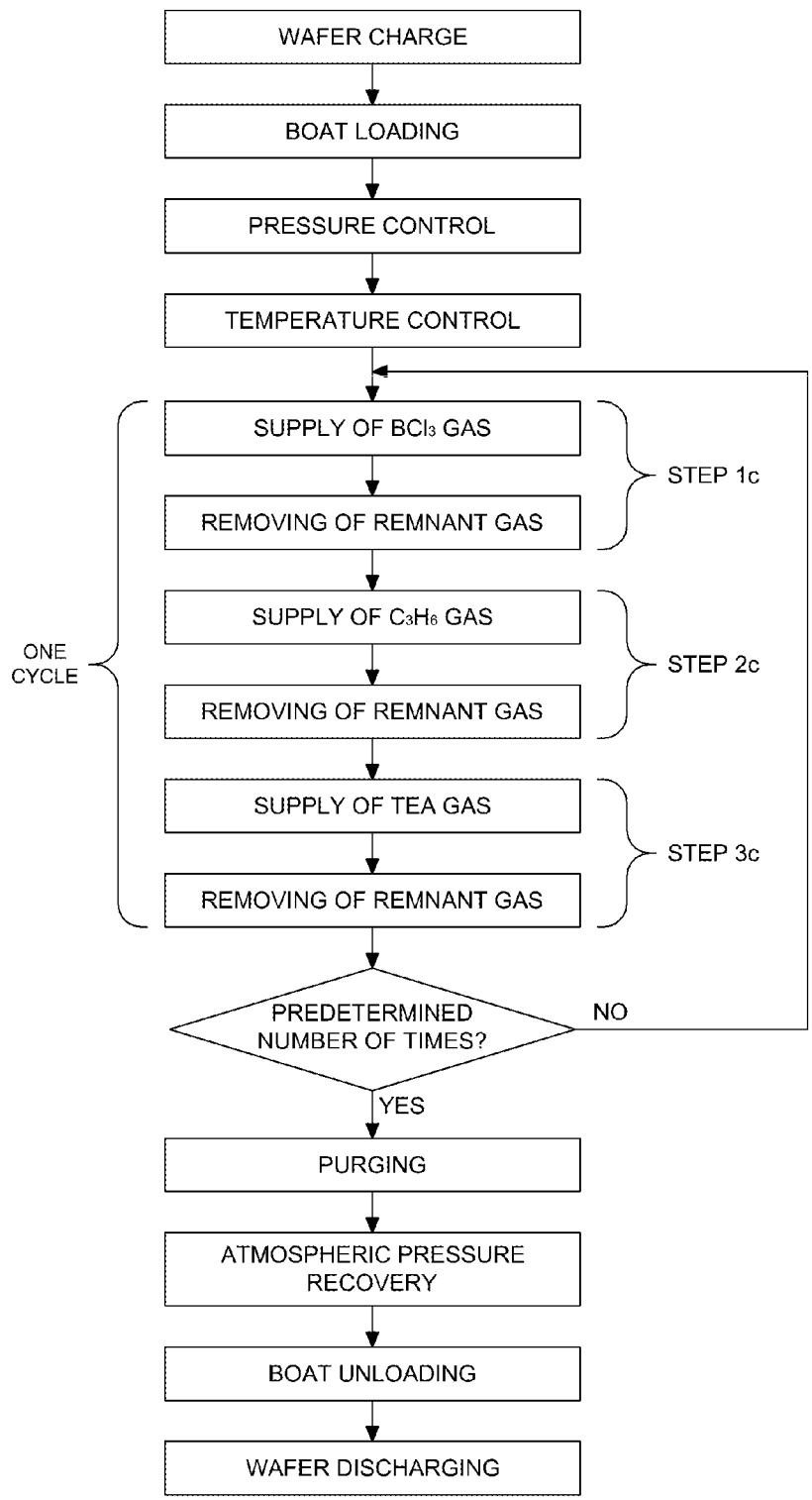
FIG. 10 illustrates a film-forming flow in a film-forming sequence according to a third embodiment of the present invention.

A film-forming sequence according to the present embodiment will now be described with reference to FIGS. 10 and 11A.

In the film-forming sequence according to the present embodiment, a cycle including a process of supplying a chloroborane-based source gas ($BCl_3$ gas) as a source gas containing boron (B) and a halogen element (Cl) to the wafer 200, a process of supplying a carbon-containing gas ($C_3H_6$ gas) to the wafer 200, and a process of supplying an amine-based gas (TEA gas) consisting of the three elements carbon (C), nitrogen (N) and hydrogen (H) as a reactive gas to the substrate is performed a predetermined number of times to form a BCN film on the wafer 200.

The film-forming sequence according to the present embodiment is substantially the same as the film-forming sequence according to the first embodiment, except that step 2c is performed between steps 1c and 3c (similar to steps 1a and 2a) and a layer containing carbon (C) is reacted with TEA gas on a first layer to be modified in step 3c similar to step 2a. Steps 2c and 3c according to the present embodiment will be described below.

[Step 2c] (Supply of $C_3H_6$ Gas)

After step 1c is completed and a gas remaining in the process chamber 201 is removed, the valve 243d is opened to supply $C_3H_6$ gas into the gas supply pipe 232d. The flow rate of the $C_3H_6$ gas is adjusted by the MFC 241d and the $C_3H_6$ gas, the flow rate of which is adjusted, is supplied into the process chamber 201 via the gas supply holes 250d. The $C_3H_6$ gas supplied into the process chamber 201 is activated by heat, and exhausted from the exhaust pipe 231. In this case, the $C_3H_6$ gas activated by heat is supplied to the wafer 200. At the same time, the valve 243h is opened to supply $N_2$ gas into the gas supply pipe 232h. The $N_2$ gas is supplied into the process chamber 201 together with the $C_3H_6$ gas, and exhausted from the exhaust pipe 231.

In this case, in order to prevent the $C_3H_6$ gas from flowing into the nozzles 249a through 249c and the buffer chamber 237, the valves 243e through 243g are opened to supply $N_2$ gas into the gas supply pipes 232e through 232g. The $N_2$ gas is supplied into the process chamber 201 via the gas supply pipes 232a through 232c, the nozzles 249a through 249c and the buffer chamber 237, and exhausted from the exhaust pipe 231.

In this case, the APC valve 244 is appropriately controlled to set the inner pressure of the process chamber 201 to range, for example, from 1 to 6,000 Pa. The supply flow rate of the $C_3H_6$ gas controlled by the MFC 241d is set to range, for example, from 100 to 10,000 sccm. The supply flow rates of the $N_2$ gas controlled by the respective MFCs 241e through 241h are set to range, for example, from 100 to 10,000 sccm. In this case, the partial pressure of the $C_3H_6$ gas in the process chamber 201 is set to range, for example, from 0.01 Pa to 5,941 Pa. A duration for which the $C_3H_6$ gas is supplied to the wafer 200, i.e., a gas supply time (gas irradiation time), is set to range, for example, from 1 to 200 seconds, preferably from 1 to 120 seconds, and more preferably from 1 to 60 seconds. In this case, the temperature of the heater 207 is set such that the temperature of the wafers 200 ranges, for example, from 250 to 700° C., preferably from 300 to 650° C., and more preferably from 350 to 600° C., similar to step 1c. When the $C_3H_6$ gas is supplied by being activated by heat, a soft reaction may be caused, thereby enabling a layer containing carbon (C) to be easily formed, as will be described below.

In this case, a gas supplied into the process chamber 201 is the thermally activated $C_3H_6$ gas and $BCl_3$ gas is not supplied into the process chamber 201. Thus, the $C_3H_6$ gas is supplied in an activated state to the wafer without causing a gas phase reaction. In this case, a carbon-containing layer is formed to a thickness of less than one atomic layer on the first layer formed on the wafer 200 in step 1c. That is, a discontinuous carbon-containing layer is formed on the first layer. Thus, a layer containing boron (B), chlorine (Cl) and carbon (C), i.e., a carbon-containing layer, is formed on the first layer (which may also be referred to hereinafter as the 'first layer on which the carbon-containing layer is formed'). However, according to conditions, a part of the first layer may react with the $C_3H_6$ gas to modify (carbonize) the first layer, thereby obtaining a boron carbide layer (a BC layer containing chlorine (Cl)) as a layer containing boron (B), chlorine (Cl) and carbon (C).

The carbon-containing layer formed on the first layer may be a carbon (C) layer or a chemical adsorption layer of the carbon-containing gas ($C_3H_6$ gas), i.e., a chemical adsorption layer of a material ($C_xH_y$) decomposed by the $C_3H_6$ gas. Here, the carbon layer may be a discontinuous layer formed of carbon (C). In addition, the chemical adsorption layer of $C_xH_y$ may be a chemical adsorption layer containing discontinuous $C_xH_y$ molecules. When the carbon-containing layer formed on the first layer is a continuous layer, e.g., when a chemical adsorption layer of $C_xH_y$ is formed on the first layer by saturating an adsorbed state of $C_xH_y$ on the first layer, a surface of the first layer is entirely covered with the chemical adsorption layer of $C_xH_y$. In this case, boron (B) and chlorine (Cl) are not present in a surface of the first layer on which the carbon-containing layer is formed. As a result, in step 3c, it may be difficult to modify the first layer on which the carbon-containing layer is formed. This is because under the conditions described above, a ligand (ethyl group) contained in a reactive gas (TEA gas) reacts with boron (B) and chlorine (Cl) but does not easily react with carbon (C). In order to cause a modification reaction to occur in step 3c which will be described below, the adsorbed state of $C_xH_y$ on the first layer should be unsaturated and a surface of the first layer on which the carbon-containing layer is formed should be exposed to boron (B) and chlorine (Cl).

In order to unsaturate the adsorbed state of $C_xH_y$ on the first layer, process conditions in step 2c are preferably set to be the same as those described above. In addition, the adsorbed state of $C_xH_y$ on the first layer may be easily unsaturated when the process conditions in step 2c are set as follows.

Temperature of wafer: 500° C. to 650° C.
Pressure in process chamber: 133 Pa to 5,332 Pa
Partial pressure of $C_3H_6$ gas: 33 Pa to 5,177 Pa
Supply flow rate of $C_3H_6$ gas: 1,000 sccm to 10,000 sccm
Supply flow rate of $N_2$ gas: 300 sccm to 3,000 sccm
Supply duration of $C_3H_6$ gas: 6 to 200 seconds (Removing of Remnant Gas)

After the carbon-containing layer is formed on the first layer, the valve 243d is closed to stop the supply of the $C_3H_6$ gas. In this case, the inside of the process chamber 201 is vacuum-exhausted by the vacuum pump 246 while the APC valve 244 is open, thereby eliminating the $C_3H_6$ gas (that does not react or that has contributed to the formation of the carbon-containing layer) or byproducts remaining in the process chamber 201 from the process chamber 201. In this case, $N_2$ gas is continuously supplied into the process chamber 201 while the valves 243e through 243h are open. The $N_2$ gas acts as a purge gas to increase the effect of eliminating the $C_3H_6$ gas (that does not react or that has contributed to the formation of the carbon-containing layer) or byproducts remaining in the process chamber 201 from the process chamber 201.

In this case, the gas remaining in the process chamber 201 may not be completely eliminated and the inside of the process chamber 201 may not be completely purged. When a small amount of gas remains in the process chamber 201, step 3c to be performed thereafter will not be badly influenced by the gas. In this case, the flow rate of the $N_2$ gas to be supplied into the process chamber 201 need not be high. For example, the inside of the process chamber 201 may be purged without causing step 3c to be badly influenced by the gas by supplying an amount of a gas corresponding to the capacity of the reaction tube 203 (process chamber 201). When the inside of the process chamber 201 is not completely purged, a purge time may be reduced to improve the throughput. Furthermore, the consumption of the $N_2$ gas may be suppressed to a necessary minimum level.

As the carbon-containing gas, not only propylene ($C_3H_6$) gas but also a hydrocarbon-based gas such as acetylene ($C_2H_2$) gas or ethylene ($C_2H_4$) gas may be used. The carbon-containing gas acts as a carbon source. When a hydrocarbon-based gas containing no nitrogen (N) is used as the carbon-containing gas, the BCN film may be easily controlled such that a nitrogen (N) component is suppressed from increasing and the rate of a carbon (C) component increase.

[Step 3c] (Supply of TEA Gas)

After step 2c is completed and the gas remaining in the process chamber 201 is removed, step 3c is performed to supply TEA gas to the wafers in the process chamber 201. Step 3c is performed similar to step 2a according to the first embodiment.

When the TEA gas is supplied on the wafers 200 according to the same order and conditions in step 2a, the first layer on which the carbon-containing layer is formed in step 2c reacts with the TEA gas on the wafer 200. That is, a chlorine (Cl) group present on an exposed surface of the first layer on which the carbon-containing layer is formed may react with a ligand (ethyl group) contained in the TEA gas. In this case, a reaction similar to the reaction between the layer and the TEA gas in step 2a according to the first embodiment occurs.

Through the series of reactions described above, the first layer on which the carbon-containing layer is formed is changed (modified) into a second layer containing boron (B), carbon (C) and nitrogen (N), i.e., a BCN layer. The second layer has a thickness of, for example, less than one atomic layer to several atomic layers. A nitrogen (N) component or a carbon (C) component contained in a ligand contained in the TEA gas is newly introduced into the first layer on which the carbon-containing layer is formed, similar to step 2a according to the first embodiment. In addition, the second layer is a layer in which the amount of impurities such as chlorine (Cl) is small, similar to step 2a according to the first embodiment.

(Removing of Remnant Gas)

Thereafter, according to the same order and conditions in step 2a according to the first embodiment, the TEA gas (that does not react or that has contributed to the reaction) or byproducts remaining in the process chamber 201 are eliminated from the process chamber 201. In this case, the gas remaining in the process chamber 201 may not be completely eliminated and the inside of the process chamber 201 may not be completely purged, similar to step 2a according to the first embodiment.

(Performing a Cycle a Predetermined Number of Times)

A BCN film having a predetermined composition may be formed on the wafer 200 to a predetermined thickness by performing a cycle including steps 1c to 3c at least once (a predetermined number of times). The cycle described above is preferably performed a plurality of times. That is, a thickness of a BCN layer to be formed per cycle may be set to be less than a desired thickness and the cycle may be performed a plurality of times until the BCN film has the desired thickness.

Effects of the Present Embodiment

The film-forming sequence according to the present embodiment has effects similar to those of the first embodiment. In addition, in the film-forming sequence according to the present embodiment, after step 1c is performed to form the first layer on the wafer 200, not only a carbon (C) component contained in TEA gas but also a carbon (C) component contained in $C_3H_6$ gas may be newly added to the BCN film by performing step 2c to supply $C_3H_6$ gas to the wafer 200, i.e., by forming a film using two types of carbon sources (double carbon source) in one cycle. That is, the concentration of carbon (C) in the BCN film may be increased more than when a film is formed using one type of carbon source (single carbon source) in one cycle.

Modified Example

Figure 11A:
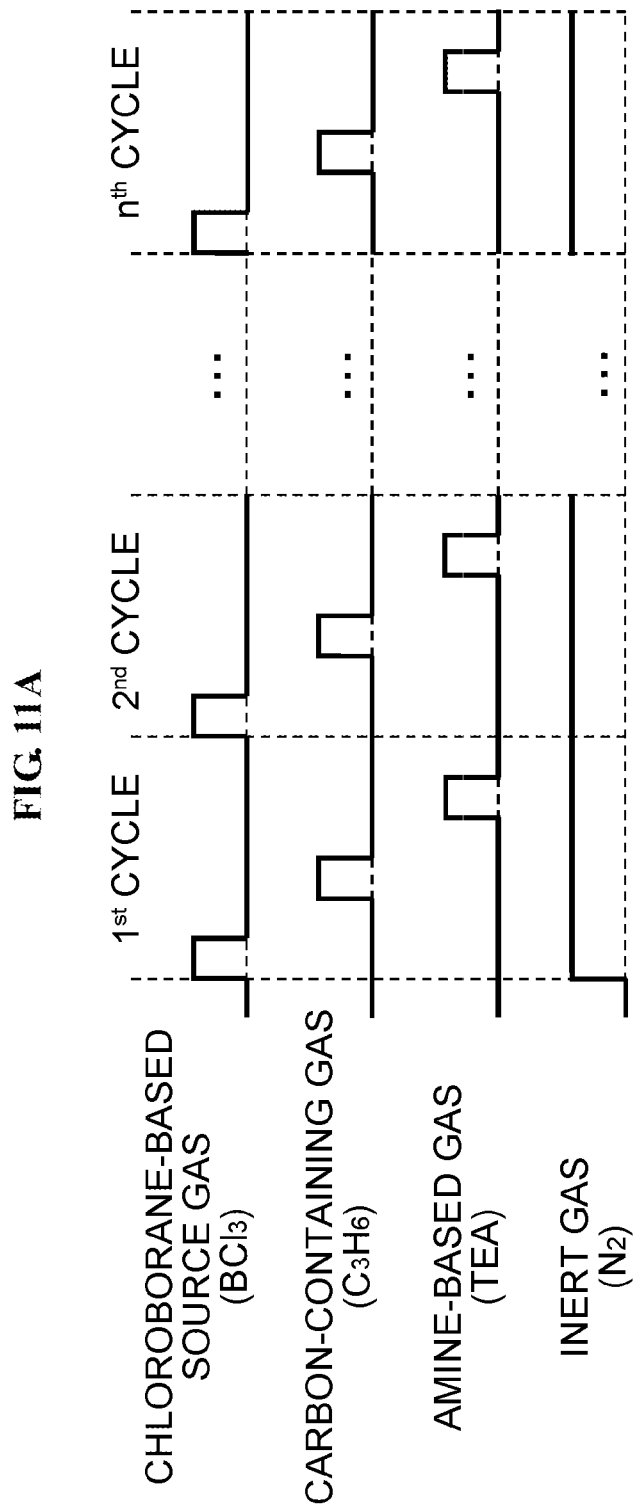
FIG. 11A illustrates gas supply timing in the film-forming sequence according to the third embodiment.

In a film-forming sequence illustrated in FIG. 11A, a case in which a process of supplying $C_3H_6$ gas is performed between a process of supplying $BCl_3$ gas and a process of supplying TEA gas is illustrated. However, embodiments of the present invention are not limited thereto. For example, as illustrated in FIG. 11B, the process of supplying $C_3H_6$ gas may be performed during a process of supplying $BCl_3$ gas. In addition, for example, as illustrated in FIG. 11C, the process of supplying $C_3H_6$ gas may be performed during the process of supplying the TEA gas. That is, the $C_3H_6$ gas may be supplied while the supply of the $BCl_3$ gas or the TEA gas is stopped or while the $BCl_3$ gas or the TEA gas is supplied. However, the process of supplying $C_3H_6$ gas is preferably performed during the process of supplying the TEA gas rather than during the process of supplying the $BCl_3$ gas, so that a gas phase reaction between the $BCl_3$ gas and the $C_3H_6$ gas in the process chamber 201 may be avoided, i.e., particles may be suppressed from being generated in the process chamber 201.

Other Embodiments of the Present Invention

Various embodiments of the present invention have been described above. However, the present invention is not limited thereto and may be embodied in many different forms without departing from the spirit and scope of the invention.

For example, in the previous embodiments, when a BCN film is formed on the wafer 200, the process of supplying the $C_3H_6$ gas may be performed in at least one among the process of supplying the $BCl_3$ gas, the process of supplying the TEA gas, and the process of supplying the $NH_3$ gas, thereby easily increasing a carbon (C) component in the BCN film.

When the process of supplying the $C_3H_6$ gas is performed in the process of supplying the $BCl_3$ gas, the $C_3H_6$ gas may be supplied in at least a section of a period in which the $BCl_3$ gas is supplied, in a period in which the supply of the $BCl_3$ gas is stopped, i.e., a period before the process of supplying the $BCl_3$ gas begins and/or a period after the process of supplying the $BCl_3$ gas is stopped), or both of them. In addition, when the process of supplying the $C_3H_6$ gas is performed in the process of supplying the TEA gas, the $C_3H_6$ gas may be supplied in at least a section of a period in which the TEA gas is supplied, a period in which the supply of the TEA gas is stopped, or both of them. In addition, when the process of supplying the $C_3H_6$ gas is performed in the process of supplying the $NH_3$ gas, the $C_3H_6$ gas may be performed in at least a section of a period in which the $NH_3$ gas is supplied, a period in which the supply of the $NH_3$ gas is stopped, or both of them.

However, the process of supplying the $C_3H_6$ gas is preferably performed in the process of supplying the TEA gas or the process of supplying the $NH_3$ gas rather than in the process of supplying the $BCl_3$ gas, so that a gas phase reaction between the $BCl_3$ gas and the $C_3H_6$ gas in the process chamber 201 may be avoided. That is, the process of supplying the $C_3H_6$ gas is preferably performed in the process of supplying the TEA gas or the process of supplying the $NH_3$ gas rather than in the process of supplying the $BCl_3$ gas, so that particles may be suppressed from being generated in the process chamber 201.

Also, in order to easily increase the rate of a carbon (C) component in the BCN film, the process of supplying the $C_3H_6$ gas is preferably performed in the process of supplying the TEA gas rather than in the process of supplying the $NH_3$ gas. That is, in order to increase the controllability of the composition of the BCN film, the process of supply in the $C_3H_6$ gas is preferably performed in the process of supplying the TEA gas rather than in the process of supplying the $NH_3$ gas.

In the previous embodiments, cases in which a chloroborane-based source gas is supplied to the wafers 200 in the process chamber 201 and then an amine-based gas is supplied to the wafers 200 in order to form the second layer containing boron (B), nitrogen (N) and carbon (C) have been described. However, the present invention is not limited thereto. For example, an order in which the chloroborane-based source gas and the amine-based gas are supplied may be reversed. That is, the amine-based gas may be supplied and then the chloroborane-based source gas may be supplied. That is, one of the chloroborane-based source gas and the amine-based gas may be supplied and then the other may be supplied. By changing an order in which gases are supplied, the quality or composition of a thin film to be formed may be changed.

In the previous embodiments, cases in which the chloroborane-based source gas is used to form the first layer in each of the sequences have been described. The present invention is, however, not limited to the embodiments set forth herein. For example, a borane-based source gas containing halogen-based ligands other than chloro groups may be used instead of the chloroborane-based source gas. For example, a fluoroborane-based source gas may be used instead of the chloroborane-based source gas. Here, the fluoroborane-based source gas means a gaseous fluoroborane-based source, e.g., a gas obtained by vaporizing a fluoroborane-based source that is in a liquid state at room temperature and normal pressure, or a fluoroborane-based source that is in a gas state at room temperature and normal pressure. In addition, the fluoroborane-based source is a borane-based source containing a fluoro group as a halogen group and is a source containing at least boron (B) and fluorine (F). That is, in the present disclosure, the fluoroborane-based source may be understood as a type of a halide. As the fluoroborane-based source gas, for example, a boron fluoride gas such as tri-fluoroborane ($BF_3$) gas or tetra-fluorodiborane ($B_2F_4$) gas may be used. In this case, a fluoroborane-based source gas is supplied to the wafers 200 when the first layer is formed in each of the sequences. In this case, the first layer is a layer containing boron (B) and fluoride (F), i.e., a boron-containing layer containing fluorine (F).

In the previous embodiments, cases in which an amine-based gas is used as a reactive gas have been described. The present invention is, however, not limited to such cases. For example, a gas containing an organic hydrazine compound, i.e., an organic hydrazine-based gas, may be used as the reactive gas, instead of the amine-based gas. The gas containing the organic hydrazine compound may also be referred to as simply an organic hydrazine compound gas or an organic hydrazine gas. Here, the organic hydrazine-based gas is a gas containing a hydrazine group, such as an organic hydrazine that is in a gas state, e.g., a gas obtained by vaporizing an organic hydrazine that is in a liquid state at room temperature and normal pressure, or an organic hydrazine that is in a gas state at room temperature and normal pressure. The organic hydrazine-based gas is a gas that consists of the three elements carbon (C), nitrogen (N) and hydrogen (H) and does not contain boron (B), and is a gas that does not contain boron (B) or a metal. For example, a methyl hydrazine-based gas obtained by vaporizing monomethyl hydrazine [$(CH_3)HN_2H_2$, abbreviated as MMH], dimethyl hydrazine [$(CH_3)_2N_2H_2$, abbreviated as DMH], trimethyl hydrazine [$(CH_3)_2N_2(CH_3)H$, abbreviated as TMH], etc., or an ethyl hydrazine-based gas obtained by vaporizing ethylhydrazine [$(C_2H_5)HN_2H_2$, abbreviated as EH], etc. is preferably used as the organic hydrazine-based gas. As the organic hydrazine-based gas, a gas consisting of the three elements carbon (C), nitrogen (N) and hydrogen (H) and having an empirical formula (one molecule) in which the number of carbon (C) atoms is greater than the number of nitrogen (N) atoms may be used. In addition, a gas containing a plurality of ligands containing carbon (C) atoms in an empirical formula (in one molecule), i.e., a gas containing a plurality of hydrocarbon groups, such as alkyl groups, in an empirical formula (in one molecule) may be used as the organic hydrazine-based gas. Specifically, a gas containing two or three ligands (hydrocarbon groups such as alkyl groups) containing carbon (C) atoms in an empirical formula (in one molecule) may be used as the organic hydrazine-based gas.

Also, in the previous embodiments, cases in which a type of thin film (single film) is formed on the wafers 200 at once in each of the sequences have been described. The present invention is, however, not limited thereto. For example, a multilayer film containing at least two types of thin films may be formed on the wafer 200 at once by appropriately combining the sequences. For example, a multilayer film in which a BCN film and a BN film are alternately stacked may be formed on the wafer 200 by alternately performing the film-forming sequences according to the first and third embodiments and the film-forming sequence according to the second embodiment in-situ a predetermined number of times (at least once).

When a BCN film or a BN film formed according to each of the various embodiments or modifications is used as a sidewall spacer, a technique of forming a highly processable device having low leak current can be provided.

When a BCN film or a BN film formed according to each of the various embodiments or modifications is used as a hard mask or an etch stopper layer, a technique of forming a highly processable device can be provided.

According to the various embodiments or modifications, a BCN film or a BN film having an ideal stoichiometric rate may be formed without using plasma in even a low-temperature region. Since a BCN film or a BN film may be formed without using plasma, the present invention is applicable, for example, to a process sensitive to plasma damage, e.g., a process of forming an SADP film of DPT.

In order to form a thin film as described above, a plurality of process recipes (programs storing a process sequence or conditions) are preferably individually prepared according to the details of substrate processing (the type, composition, quality, thickness, etc. of a thin film to be formed). When substrate processing begins, an appropriate process recipe is preferably selected among the plurality of process recipes according to the details of substrate processing. Specifically, a plurality of process recipes that are individually prepared according to the details of substrate processing are preferably stored (installed) beforehand in the memory device 121c of the substrate processing apparatus via an electrical communication line or a recording medium (e.g., the external memory device 123) storing the process recipes. When substrate processing begins, the CPU 121a of the substrate processing apparatus preferably selects an appropriate process recipe among the plurality of process recipes stored in the memory device 121c according to the details of substrate processing. Accordingly, with one substrate processing apparatus, various types of multi-purpose thin films can be reproducibly formed in various compositions, to have various qualities, and to various thicknesses. In addition, it is possible to decrease a burden on an operator's manipulation (for example, when a processing sequence, conditions, etc. are input) and to immediately begin substrate processing without causing errors in manipulation.

The process recipes described above are not limited to newly prepared process recipes. For example, the process recipes may be prepared by changing process recipes that have already been installed in a substrate processing apparatus. When a process recipe is changed, the changed process recipe may be installed in a substrate processing apparatus via an electrical communication line or a recording medium storing the process recipe. In addition, the process recipe that has already been installed in the substrate processing apparatus may be directly changed by directly manipulating the I/O device 122 included in the existing substrate processing apparatus.

In the previous embodiments, cases in which a thin film is formed using a batch type substrate processing apparatus capable of processing a plurality of substrates at a time have been described. The present invention is, however, not limited to these embodiments. For example, the present invention is preferably applicable to cases in which a thin film is formed using a single-wafer type substrate processing apparatus capable of processing one or several substrates at a time. In addition, in the previous embodiments, cases in which a thin film is formed using a substrate processing apparatus including a hot wall type process furnace have been described. The present invention is not limited to the previous embodiments, and is preferably applicable to cases in which a thin film is formed using a substrate processing apparatus including a cold wall type process furnace.

An appropriate combination of the embodiments, the modified examples, or the application examples described above may be used.

According to the present invention, the controllability of the concentration of carbon (C) in a film may be increased by improving the yield when a BCN film or a BN film is formed.

Exemplary Embodiments of the Present Invention

The following supplementary notes are added herein as exemplary embodiments of the present invention.

(Supplementary Note 1)

According to one aspect of the present invention, there is provided a method of manufacturing a semiconductor device, including forming a film containing boron, carbon and nitrogen or a film containing boron and nitrogen on a substrate by performing, a predetermined number of times, a cycle including (a) supplying a source gas containing boron and a halogen element to the substrate and (b) supplying a reactive gas consisting of carbon, nitrogen and hydrogen to the substrate.

(Supplementary Note 2)

In the method of Supplementary note 1, it is preferable that the reactive gas includes at least one of amine and organic hydrazine.

(Supplementary Note 3)

In the method of Supplementary note 1 or 2, it is preferable that the reactive gas includes at least one amine selected from a group consisting of ethylamine, methylamine, propylamine, isopropylamine, butylamine and isobutylamine.

(Supplementary Note 4)

In the method of any one of Supplementary notes 1 through 3, it is preferable that the reactive gas is boron-free.

(Supplementary Note 5)

In the method of any one of Supplementary notes 1 through 4, it is preferable that the reactive gas is boron-free and metal-free.

(Supplementary Note 6)

In the method of any one of Supplementary notes 1 through 5, it is preferable that the halogen element includes one of chlorine and fluorine.

(Supplementary Note 7)

In the method of any one of Supplementary notes 1 through 6, it is preferable that the halogen element in the source gas and hydrogen in the reactive gas are discharged in gaseous state when the film is formed.

(Supplementary Note 8)

In the method of any one of Supplementary notes 1 through 7, it is preferable that a first layer containing boron and the halogen element is formed in the step (a), and a second layer containing boron, carbon and nitrogen is formed by reacting the first layer with the reactive gas in the step (b).

(Supplementary Note 9)

In the method of Supplementary note 8, it is preferable that in the step (b) the first layer reacts with the reactive gas, at least a portion of atoms of the halogen element in the first layer is drawn out from the first layer, at least a portion of ligands in the reactive gas is separated from the reactive gas, and nitrogen in the reactive gas with at least the portion of ligands separated therefrom is bonded to boron in the first layer.

(Supplementary Note 10)

In the method of any one of Supplementary notes 1 through 9, it is preferable that the cycle further includes (c) supplying a nitriding gas to the substrate.

(Supplementary Note 11)

In the method of Supplementary note 10, it is preferable that a first layer containing boron and the halogen element is formed in the step (a), a second layer containing boron, carbon and nitrogen is formed by reacting the first layer with the reactive gas in the step (b), and a third layer containing boron, carbon and nitrogen or containing boron and nitrogen is formed by nitriding the second layer in the step (c).

(Supplementary Note 12)

According to another aspect of the present invention, there is provided a substrate processing method including forming a film containing boron, carbon and nitrogen or a film containing boron and nitrogen on the substrate by performing, a predetermined number of times, a cycle including supplying a source gas including boron and a halogen element to a substrate and supplying a reactive gas consisting of carbon, nitrogen and hydrogen to the substrate.

(Supplementary Note 13)

In the substrate processing method of Supplementary note 12, it is preferable that the cycle further includes supplying a nitriding gas to the substrate.

(Supplementary Note 14)

According to another aspect of the present invention, there is provided a substrate processing apparatus including: a process chamber configured to accommodate a substrate; a source gas supply system configured to supply a source gas containing boron and a halogen element into the process chamber;

a reactive gas supply system configured to supply a reactive gas consisting of carbon, nitrogen and hydrogen into the process chamber; and a controller configured to control the source gas supply system and the reactive gas supply system to perform a formation of a film containing boron, carbon and nitrogen or a film containing boron and nitrogen on the substrate by performing, a predetermined number of times, a cycle including supplying the source gas to the substrate in the process chamber and supplying the reactive gas to the substrate in the process chamber.

(Supplementary Note 15)

The substrate processing apparatus of Supplementary note 14 preferably further includes a nitriding gas supply system configured to supply a nitriding gas into the process chamber, wherein the controller is configured to control the source gas supply system, the reactive gas supply system and the nitriding gas supply system to perform a formation of a film containing boron, carbon and nitrogen or a film containing boron and nitrogen on the substrate by performing, a predetermined number of times, a cycle including supplying a source gas to a substrate in the process chamber, supplying a reactive gas to the substrate in the process chamber and supplying a nitriding gas to the substrate in the process chamber.

(Supplementary Note 16)

According to another aspect of the present invention, there is provided a program and a non-transitory computer-readable recording medium storing the program that causes a computer to perform a formation of a film containing boron, carbon and nitrogen or a film containing boron and nitride on a substrate by performing, a predetermined number of times, a cycle including supplying a source gas containing boron and a halogen element to the substrate and supplying a reactive gas consisting of carbon, nitrogen and hydrogen to the substrate.

(Supplementary Note 17)

In the program and the non-transitory recording medium of Supplementary note 16, it is preferable that the cycle further includes supplying a nitriding gas to the substrate.

What is claimed is:

1. A method of manufacturing a semiconductor device, comprising forming a film containing boron, carbon and nitrogen or a film containing boron and nitrogen on a substrate by performing, a predetermined number of times, a cycle comprising: (a) supplying a source gas comprising a molecule containing boron and a halogen element to the substrate; (b) supplying a reactive gas consisting of carbon, nitrogen and hydrogen to the substrate; and (c) supplying a nitriding gas to the substrate, wherein a first layer containing boron and the halogen element is formed in the step (a), a second layer containing boron, carbon and nitrogen is formed by reacting the first layer with the reactive gas in the step (b), and a third layer containing boron, carbon and nitrogen or containing boron and nitrogen is formed by nitriding the second layer in the step (c).

2. The method of claim 1, wherein the reactive gas comprises at least one of amine and organic hydrazine.

3. The method of claim 1, wherein the reactive gas comprises at least one amine selected from a group consisting of ethylamine, methylamine, propylamine, isopropylamine, butylamine and isobutylamine.

4. The method of claim 1, wherein the reactive gas is boron-free.

5. The method of claim 1, wherein the reactive gas is boron-free and metal-free.

6. The method of claim 1, wherein the halogen element comprises one of chlorine and fluorine.

7. The method of claim 1, wherein the halogen element in the source gas and hydrogen in the reactive gas are discharged in gaseous state when the film is formed.

8. The method of claim 1, wherein in the step (b) the first layer reacts with the reactive gas, at least a portion of atoms of the halogen element in the first layer is drawn out from the first layer, at least a portion of ligands in the reactive gas is separated from the reactive gas, and nitrogen in the reactive gas with at least the portion of ligands separated therefrom is bonded to boron in the first layer.

9. The method of claim 1, wherein the step (c) is performed in each cycle after alternately performing the steps (a) and (b) a predetermined number of times.

10. A substrate processing apparatus comprising:
   a process chamber configured to accommodate a substrate;
   a source gas supply system configured to supply a source gas comprising a molecule containing boron and a halogen element into the process chamber;
   a reactive gas supply system configured to supply a reactive gas consisting of carbon, nitrogen and hydrogen into the process chamber;
   a nitriding gas supply system configured to supply a nitriding gas into the process chamber; and
   a controller configured to control the source gas supply system, the reactive gas supply system and the nitriding gas supply system to perform a formation of a film containing boron, carbon and nitrogen or a film containing boron and nitrogen on the substrate by performing, a predetermined number of times, a cycle comprising: supplying the source gas to the substrate in the process chamber to form a first layer containing boron and the halogen element; supplying the reactive gas to the substrate in the process chamber to form a second layer containing boron, carbon and nitrogen by reacting the first layer with the reactive gas; and supplying a nitriding gas to the substrate to form a third layer containing boron, carbon and nitrogen or containing boron and nitrogen by nitriding the second layer.

11. A non-transitory computer-readable recording medium storing a program that causes a computer to perform a formation of a film containing boron, carbon and nitrogen or a film containing boron and nitride on a substrate by performing, a predetermined number of times, a cycle comprising: supplying a source gas comprising a molecule containing boron and a halogen element to the substrate to form a first layer containing boron and the halogen element; supplying a reactive gas consisting of carbon, nitrogen and hydrogen to the substrate to form a second layer containing boron, carbon and nitrogen by reacting the first layer with the reactive gas; and supplying a nitriding gas to the substrate to form a third layer containing boron, carbon and nitrogen or containing boron and nitrogen by nitriding the second layer.

* * * * *